(12) United States Patent
Howard et al.

(10) Patent No.: US 9,953,951 B2
(45) Date of Patent: Apr. 24, 2018

(54) METHOD OF PROVIDING A FLEXIBLE SEMICONDUCTOR DEVICE AND FLEXIBLE SEMICONDUCTOR DEVICE THEREOF

(71) Applicants: Emmett Howard, Tempe, AZ (US); Nicholas Munizza, Gilbert, AZ (US); Paul Yee, Chandler, AZ (US); Michael Marrs, Phoenix, AZ (US)

(72) Inventors: Emmett Howard, Tempe, AZ (US); Nicholas Munizza, Gilbert, AZ (US); Paul Yee, Chandler, AZ (US); Michael Marrs, Phoenix, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 15/349,511

(22) Filed: Nov. 11, 2016

(65) Prior Publication Data
US 2017/0062380 A1  Mar. 2, 2017

Related U.S. Application Data

(63) Continuation of application No. PCT/US2015/029991, filed on May 8, 2015.
(Continued)

(51) Int. Cl.
*H01L 23/00* (2006.01)
*H01L 21/02* (2006.01)
(Continued)

(52) U.S. Cl.
CPC .......... *H01L 24/83* (2013.01); *H01L 21/6835* (2013.01); *H01L 24/29* (2013.01);
(Continued)

(58) Field of Classification Search
None
See application file for complete search history.

(56) References Cited

U.S. PATENT DOCUMENTS

| 3,089,801 | A | 5/1963 | Tierney et al. |
| 3,684,637 | A | 8/1972 | Andersen et al. |

(Continued)

FOREIGN PATENT DOCUMENTS

| CN | 1332599 | 1/2002 |
| CN | 1118075 | 8/2003 |

(Continued)

OTHER PUBLICATIONS

International Search Report and Written Opinion for PCT/US2016/036505, dated Mar. 17, 2017.
(Continued)

*Primary Examiner* — Khaja Ahmad
(74) *Attorney, Agent, or Firm* — Bryan Cave LLP

(57) ABSTRACT

Some embodiments include a method. The method can comprise: providing a carrier substrate; providing an adhesion modification layer over the carrier substrate; providing a device substrate; and coupling the device substrate and the carrier substrate together, the adhesion modification layer being located between the device substrate and the carrier substrate when the device substrate and the carrier substrate are coupled together. In these embodiments, the adhesion modification layer can be configured so that the device substrate couples indirectly with the carrier substrate by way of the adhesion modification layer with a first bonding force that is greater than a second bonding force by which the device substrate couples with the carrier substrate absent the adhesion modification layer. Other embodiments of related methods and devices are also disclosed.

20 Claims, 12 Drawing Sheets

Related U.S. Application Data

(60) Provisional application No. 61/992,799, filed on May 13, 2014.

(51) Int. Cl.
*H01L 33/12* (2010.01)
*H01L 21/683* (2006.01)

(52) U.S. Cl.
CPC .............. *H01L 2221/6835* (2013.01); *H01L 2221/68318* (2013.01); *H01L 2221/68381* (2013.01); *H01L 2224/8309* (2013.01); *H01L 2224/83359* (2013.01)

(56) References Cited

U.S. PATENT DOCUMENTS

| | | | |
|---|---|---|---|
| 3,723,635 A | 3/1973 | Smith | |
| 4,337,107 A | 6/1982 | Eshleman | |
| 4,349,593 A | 9/1982 | Blechstein | |
| 4,489,487 A | 12/1984 | Bura | |
| 4,858,073 A | 8/1989 | Gregory | |
| 5,098,772 A | 3/1992 | af Strom | |
| 5,117,114 A | 5/1992 | Street et al. | |
| 5,220,488 A | 6/1993 | Denes | |
| 5,229,882 A | 7/1993 | Rowland | |
| 5,252,383 A | 10/1993 | Fukutake et al. | |
| 5,264,063 A | 11/1993 | Martin | |
| 5,292,686 A | 3/1994 | Riley et al. | |
| 5,453,157 A | 9/1995 | Jeng | |
| 5,702,980 A | 12/1997 | Yu et al. | |
| 5,714,305 A | 2/1998 | Teng et al. | |
| 5,842,722 A | 12/1998 | Carlson | |
| 5,853,511 A | 12/1998 | Fairbanks | |
| 5,861,470 A | 1/1999 | Voss et al. | |
| 5,869,150 A | 2/1999 | Iwamoto | |
| 5,890,429 A | 4/1999 | Alam et al. | |
| 5,916,652 A | 6/1999 | Miner et al. | |
| 6,051,169 A | 4/2000 | Brown et al. | |
| 6,051,508 A | 4/2000 | Takase et al. | |
| 6,083,580 A | 7/2000 | Finestone et al. | |
| 6,177,163 B1 | 1/2001 | Blok et al. | |
| 6,358,832 B1 | 3/2002 | Edelstein et al. | |
| 6,482,288 B1 | 11/2002 | Kreckel et al. | |
| 6,531,389 B1 | 3/2003 | Shue et al. | |
| 6,541,398 B2 | 4/2003 | Grill et al. | |
| 6,572,780 B2 | 6/2003 | McCormack et al. | |
| 6,580,035 B1 | 6/2003 | Chung | |
| 6,627,037 B1 | 9/2003 | Kurokawa et al. | |
| 6,630,289 B1 | 10/2003 | Kwok et al. | |
| 6,632,746 B2 | 10/2003 | Kanegae et al. | |
| 6,670,265 B2 | 12/2003 | Wang et al. | |
| 6,746,969 B2 | 6/2004 | Shimada et al. | |
| 6,752,160 B2 | 6/2004 | Chen | |
| 6,808,773 B2 | 10/2004 | Shimamura et al. | |
| 6,825,068 B2 | 11/2004 | Denis et al. | |
| 6,856,670 B2 | 2/2005 | Hoheisel | |
| 7,078,702 B2 | 7/2006 | Ringermacher et al. | |
| 7,212,088 B1 | 5/2007 | Norregaard et al. | |
| 7,316,942 B2 | 1/2008 | Sarma et al. | |
| 7,329,601 B2 | 2/2008 | Miyajima | |
| 7,344,993 B2 | 3/2008 | Balasubramaniam et al. | |
| 7,375,341 B1 | 5/2008 | Nagarkar et al. | |
| 7,385,224 B2 | 6/2008 | Ishii et al. | |
| 7,481,901 B2 | 1/2009 | Toyoda et al. | |
| 7,538,038 B2 | 5/2009 | Matsushita et al. | |
| 7,563,026 B2 | 7/2009 | Mandelkem et al. | |
| 7,681,310 B2 | 3/2010 | Chinda et al. | |
| 7,795,006 B2 | 9/2010 | Nagino et al. | |
| 7,838,328 B2 | 11/2010 | Isa | |
| 7,906,193 B2 | 3/2011 | Yukawa et al. | |
| 8,038,820 B2 | 10/2011 | Kim et al. | |
| 8,048,251 B2 | 11/2011 | Yamashita et al. | |
| 8,383,520 B2 | 2/2013 | Marrs | |
| 8,481,859 B2 | 7/2013 | Haq et al. | |
| 8,992,712 B2 | 3/2015 | Loy et al. | |
| 8,999,778 B2 | 4/2015 | O'Rourke et al. | |
| 9,076,822 B2 | 7/2015 | Loy et al. | |
| 9,155,190 B2 | 10/2015 | Haq et al. | |
| 9,507,011 B2 | 11/2016 | Zhang et al. | |
| 9,601,530 B2 | 3/2017 | Marrs | |
| 2002/0008839 A1 | 1/2002 | Miyai et al. | |
| 2002/0018173 A1 | 2/2002 | Furukawa et al. | |
| 2002/0081863 A1 | 6/2002 | Shimada et al. | |
| 2003/0031296 A1 | 2/2003 | Hoheisel | |
| 2003/0069331 A1 | 4/2003 | Teiichi et al. | |
| 2003/0072889 A1 | 4/2003 | Abrams | |
| 2003/0143822 A1 | 7/2003 | Kondo et al. | |
| 2003/0201465 A1 | 10/2003 | Ryuzaki et al. | |
| 2004/0008298 A1 | 1/2004 | Kwok et al. | |
| 2004/0110326 A1 | 6/2004 | Forbes et al. | |
| 2004/0219289 A1 | 11/2004 | Lamotte et al. | |
| 2005/0186801 A1 | 8/2005 | Uno et al. | |
| 2005/0221542 A1 | 10/2005 | Yamazaki et al. | |
| 2005/0221599 A1 | 10/2005 | Kanegae et al. | |
| 2005/0233583 A1 | 10/2005 | Miyajima | |
| 2005/0242341 A1 | 11/2005 | Knudson et al. | |
| 2006/0017154 A1 | 1/2006 | Eguchi et al. | |
| 2006/0019491 A1 | 1/2006 | Soda | |
| 2006/0148141 A1 | 7/2006 | Seo et al. | |
| 2006/0169485 A1 | 8/2006 | Kawaguchi et al. | |
| 2006/0180815 A1 | 8/2006 | Sarma et al. | |
| 2006/0192229 A1 | 8/2006 | Kato et al. | |
| 2006/0194363 A1 | 8/2006 | Giesberg et al. | |
| 2006/0207967 A1 | 9/2006 | Bocko et al. | |
| 2006/0223282 A1 | 10/2006 | Amundson et al. | |
| 2007/0042140 A1 | 2/2007 | af Strom | |
| 2007/0054440 A1 | 3/2007 | Hu | |
| 2007/0241436 A1 | 10/2007 | Ookubo et al. | |
| 2007/0257311 A1* | 11/2007 | Kuwabara | H01L 27/13 257/347 |
| 2008/0038885 A1 | 2/2008 | Lee et al. | |
| 2008/0050548 A1 | 2/2008 | Abrams | |
| 2008/0090338 A1 | 4/2008 | Tredwell et al. | |
| 2008/0105877 A1 | 5/2008 | Yamazaki et al. | |
| 2008/0122121 A1 | 5/2008 | Suda et al. | |
| 2008/0179594 A1 | 7/2008 | Oh | |
| 2008/0224243 A1 | 9/2008 | Lee | |
| 2008/0315252 A1 | 12/2008 | Shim | |
| 2009/0004419 A1 | 1/2009 | Cok et al. | |
| 2009/0008132 A1 | 1/2009 | Takasawa et al. | |
| 2009/0072122 A1 | 3/2009 | Hiroshi et al. | |
| 2009/0101903 A1 | 4/2009 | Chen et al. | |
| 2009/0108304 A1 | 4/2009 | Ng et al. | |
| 2009/0134390 A1 | 5/2009 | Kodama et al. | |
| 2009/0176039 A1 | 7/2009 | af Strom | |
| 2009/0202857 A1 | 8/2009 | Kerr et al. | |
| 2009/0211791 A1 | 8/2009 | Tredwell et al. | |
| 2009/0229874 A1 | 9/2009 | Katagiri et al. | |
| 2009/0269874 A1 | 10/2009 | Huang et al. | |
| 2009/0294767 A1 | 12/2009 | Lujan et al. | |
| 2009/0296754 A1 | 12/2009 | Ledentsov et al. | |
| 2010/0003512 A1 | 1/2010 | Ookubo et al. | |
| 2010/0003513 A1 | 1/2010 | Ookubo et al. | |
| 2010/0025675 A1 | 2/2010 | Yamazki et al. | |
| 2010/0038023 A1 | 2/2010 | Kho et al. | |
| 2010/0051189 A1 | 3/2010 | Kawabata et al. | |
| 2010/0059171 A1 | 3/2010 | Chun et al. | |
| 2010/0059747 A1 | 3/2010 | Nakayama et al. | |
| 2010/0078573 A1 | 4/2010 | Nishino et al. | |
| 2010/0123131 A1 | 5/2010 | Tokunaga | |
| 2010/0127279 A1 | 5/2010 | Takahashi | |
| 2010/0140807 A1 | 6/2010 | Kobayashi et al. | |
| 2010/0154992 A1 | 6/2010 | Feinstein et al. | |
| 2010/0155694 A1 | 6/2010 | Miller et al. | |
| 2010/0183872 A1 | 7/2010 | Nonaka et al. | |
| 2010/0203296 A1 | 8/2010 | Tsai et al. | |
| 2010/0219410 A1 | 9/2010 | Godo et al. | |
| 2010/0267203 A1* | 10/2010 | Chen | G02F 1/133305 438/110 |
| 2010/0295161 A1 | 11/2010 | Koduri | |
| 2010/0320391 A1 | 12/2010 | Antonuk | |
| 2010/0330748 A1 | 12/2010 | Chu et al. | |
| 2011/0003442 A1 | 1/2011 | Wang et al. | |
| 2011/0048611 A1 | 3/2011 | Carre et al. | |

(56) References Cited

U.S. PATENT DOCUMENTS

| | | |
|---|---|---|
| 2011/0064953 A1 | 3/2011 | O'Rourke et al. |
| 2011/0069467 A1 | 3/2011 | Flaim et al. |
| 2011/0092006 A1 | 4/2011 | An et al. |
| 2011/0111194 A1 | 5/2011 | Carre et al. |
| 2011/0141076 A1 | 6/2011 | Fukuhara et al. |
| 2011/0141476 A1 | 6/2011 | Schmaelzle et al. |
| 2011/0204361 A1* | 8/2011 | Nishiki ............... H01L 21/268 257/52 |
| 2011/0220276 A1 | 9/2011 | Coleman et al. |
| 2011/0227203 A1 | 9/2011 | Marrs et al. |
| 2011/0228492 A1 | 9/2011 | Haq et al. |
| 2011/0230047 A1 | 9/2011 | Marrs |
| 2011/0240988 A1 | 10/2011 | Yano |
| 2011/0318544 A1 | 12/2011 | Chen et al. |
| 2012/0003815 A1* | 1/2012 | Lee .................. H01L 21/268 438/458 |
| 2012/0043468 A1 | 2/2012 | Flitsch et al. |
| 2012/0061672 A1 | 3/2012 | O'Rourke et al. |
| 2012/0107978 A1 | 5/2012 | Shin et al. |
| 2012/0146713 A1 | 6/2012 | Kim et al. |
| 2012/0164408 A1 | 6/2012 | Hwu et al. |
| 2012/0168836 A1 | 7/2012 | Lee et al. |
| 2012/0235315 A1 | 9/2012 | Wu et al. |
| 2012/0300419 A1 | 11/2012 | Tang et al. |
| 2012/0329249 A1 | 12/2012 | Ahn et al. |
| 2013/0075739 A1 | 3/2013 | Loy et al. |
| 2013/0077033 A1 | 3/2013 | Li et al. |
| 2013/0082264 A1 | 4/2013 | Couture et al. |
| 2013/0115426 A1 | 5/2013 | Fang et al. |
| 2013/0123882 A1 | 5/2013 | Towe |
| 2013/0161772 A1 | 6/2013 | Chan et al. |
| 2013/0271930 A1 | 10/2013 | Haq et al. |
| 2014/0008651 A1 | 1/2014 | Marrs |
| 2014/0065389 A1 | 3/2014 | Loy et al. |
| 2014/0254113 A1 | 9/2014 | Howard et al. |
| 2014/0274166 A1 | 9/2014 | Zhang et al. |
| 2014/0340857 A1 | 11/2014 | Hsu et al. |
| 2015/0064385 A1 | 3/2015 | Flaim et al. |
| 2015/0097301 A1 | 4/2015 | Gandhi |
| 2015/0162392 A1 | 6/2015 | Lim et al. |
| 2016/0003953 A1 | 1/2016 | Kunnen et al. |
| 2016/0005170 A1 | 1/2016 | Thiagarajan et al. |
| 2016/0005183 A1 | 1/2016 | Thiagarajan et al. |
| 2016/0037294 A1 | 2/2016 | Zhang et al. |
| 2016/0181182 A1 | 6/2016 | Smith et al. |
| 2016/0181288 A1 | 6/2016 | Smith et al. |
| 2016/0225653 A1 | 8/2016 | Marrs et al. |
| 2016/0245689 A1 | 8/2016 | Smith et al. |
| 2016/0252632 A1 | 9/2016 | Smith et al. |
| 2016/0260765 A1 | 9/2016 | Marrs |
| 2016/0260768 A1 | 9/2016 | Smith et al. |
| 2016/0329268 A1 | 11/2016 | Howard et al. |
| 2016/0343593 A1* | 11/2016 | Kang ................. H01L 21/6835 |

FOREIGN PATENT DOCUMENTS

| | | |
|---|---|---|
| CN | 1454122 | 11/2003 |
| CN | 101231972 | 7/2007 |
| CN | 101288348 | 10/2008 |
| CN | 103531442 | 1/2014 |
| EP | 2088839 | 8/2009 |
| JP | 01198094 | 8/1989 |
| JP | 07022795 | 1/1995 |
| JP | 08148814 | 6/1996 |
| JP | 11340462 | 10/1999 |
| JP | 2000338454 | 12/2000 |
| JP | 2004311912 | 11/2004 |
| JP | 2004323543 | 11/2004 |
| JP | 2005123576 | 12/2005 |
| JP | 2007073559 | 3/2007 |
| JP | 2007123861 | 5/2007 |
| JP | 2007146121 | 6/2007 |
| JP | 200971057 | 4/2009 |
| JP | 2010067849 | 3/2010 |
| JP | 2010226101 | 10/2010 |
| JP | 2012212939 | 11/2012 |
| KR | 20070103050 | 10/2007 |
| KR | 100810708 | 3/2008 |
| KR | 1020090098033 | 9/2009 |
| KR | 102010007703 | 1/2010 |
| KR | 1020100043654 | 4/2010 |
| KR | 1020130086807 | 8/2013 |
| WO | 9852391 | 11/1998 |
| WO | 2006088564 | 8/2006 |
| WO | 2007083906 | 7/2007 |
| WO | 2007108659 | 9/2007 |
| WO | 2008005979 | 1/2008 |
| WO | 2010051106 | 5/2010 |
| WO | 2010065457 | 6/2010 |
| WO | 2010065459 | 6/2010 |
| WO | 2010065542 | 6/2010 |
| WO | 2010138811 | 12/2010 |
| WO | 2012021196 | 2/2012 |
| WO | 2012021197 | 2/2012 |
| WO | 2012138903 | 10/2012 |
| WO | 2013082138 | 6/2013 |
| WO | 2014039693 | 3/2014 |
| WO | 2014039698 | 3/2014 |
| WO | 2014054949 | 4/2014 |
| WO | 2014152919 | 9/2014 |
| WO | 2014152929 | 9/2014 |
| WO | 2014165149 | 10/2014 |
| WO | 2015057719 | 4/2015 |
| WO | 2015058523 | 4/2015 |
| WO | 2015069566 | 5/2015 |
| WO | 2015069567 | 5/2015 |
| WO | 2015156891 | 10/2015 |
| WO | WO2016025463 | 2/2016 |
| WO | 2017030632 | 2/2017 |
| WO | 2017034644 | 3/2017 |
| WO | 2017034645 | 3/2017 |

OTHER PUBLICATIONS

International Search Report and Written Opinion for PCT/US2016/036502, dated Mar. 6, 2017.
R. Lujan and R. A. Street, Oxide TFTs for a flexible x-ray image sensor. Palo Alto Research Center. Flex Tech Alliance Presents: Metal Oxide TFT Devices and Technology Workshop (Jul. 2012).
R. A. Street, W. S. Wong, T. Ng & R. Lujan. Amorphous silicon thin film transistor image sensors, Philosophical Magazine, 89:28-30, 2687-2697 (Oct. 2009).
J. C. Park, S. Kim, S. Kim, C. Kim, I. Song, Y. Park, U. Jung, D. H. Kim, and J. Lee. Highly Stable Transparent Amorphous Oxide Semiconductor Thin-Film Transistors Having Double-Stacked Active Layers. Adv. Mater. 2010, 22, 5512-5516.
R. A. Lujan and R. A. Street. Flexible X-Ray Detector Array Fabricated With Oxide Thin-Film Transistors. IEEE Electron Device Letters, vol. 33, No. 5, May 2012.
International Search Report and Written Opinion from related Int'l Application No. PCT/US2015/029991, dated Jul. 31, 2015, 13 pages.
International Search Report and Written Opinion for PCT Application No. PCT/US2014/060501, dated Jan. 19, 2015, 14 pages.
International Search Report and Written Opinion from related Int'l Application No. PCT/US2013/058284, dated Dec. 26, 2013, 12 pages.
International Search Report and Written Opinion from related Int'l Application No. PCT/US2013/058293, dated Dec. 26, 2013, 12 pages.
International Search Report and Written Opinion from related Int'l Application No. PCT/US2012/066833 dated Jan. 17, 2013, 11 pages.
International Search Report and Written Opinion from related Int'l Application No. PCT/US2011/037207, dated Feb. 21, 2012, 10 pages.
International Search Report and Written Opinion from related Int'l Application No. PCT/US2011/037226 dated Feb. 21, 2012, 10 pages.

(56) References Cited

OTHER PUBLICATIONS

International Search Report and Written Opinion from related Int'l Application No. PCT/US2012/032388, dated Dec. 10, 2012, 10 pages.
International Search Report and Written Opinion from related Int'l Application No. PCT/US2010/036569, dated Dec. 27, 2012, 11 pages.
International Search Report and Written Opinion from related Int'l Application No. PCT/US2009/066259, dated May 5, 2010, 8 pages.
International Search Report and Written Opinion from related Int'l Application No. PCT/US2009/066111, dated Oct. 25, 2010, 7 pages.
International Search Report and Written Opinion from related Int'l Application No. PCT/US2009/066114 dated Mar. 9, 2010, 8 pages.
International Search Report and Written Opinion for PCT/US2017/037882 dated Dec. 5, 2017, 14 pages.

\* cited by examiner

METHOD OF PROVIDING A FLEXIBLE SEMICONDUCTOR DEVICE AND FLEXIBLE SEMICONDUCTOR DEVICE THEREOF

CROSS-REFERENCE TO RELATED APPLICATIONS

This application is a continuation of International Patent Application No. PCT/US2015/029991, filed May 8, 2015. International Patent Application No. PCT/US2015/029991 claims the benefit of U.S. Provisional Patent Application No. 61/992,799, filed May 13, 2014. International Patent Application No. PCT/US2015/029991 and U.S. Provisional Patent Application No. 61/992,799 each are incorporated herein by reference in their entirety.

STATEMENT REGARDING FEDERALLY SPONSORED RESEARCH OR DEVELOPMENT

This invention was made with government support under W911NF-04-2-0005 awarded by the Army Research Office. The government has certain rights in the invention.

FIELD OF THE INVENTION

This invention relates generally to fabricating electronic devices, and relates more particularly to fabricating electronic devices having one or more semiconductor elements over flexible substrates and the electronic devices therefrom.

DESCRIPTION OF THE BACKGROUND

In the electronics industry, flexible substrates are quickly becoming popular as a base for electronic devices. Flexible substrates can include a wide variety of materials, such as, for example, any of a myriad of plastics, metal foils, and glasses (e.g. fluorosilicate glass, borosilicate glass, Corning® glass, Willow™ glass, and/or Vitrelle glass, etc.). Once one or more desired semiconductor elements are formed over a surface of the flexible substrate, the flexible substrate can be attached to a final product or incorporated into a further structure. Typical examples of such products or structures are active matrices on flat panel displays, RFID (radio-frequency identification) tags on various commercial products in retail stores, a variety of sensors, etc.

A need exists in the art to develop a method for fabricating electronic devices having flexible substrates that allows for improved electrical characteristics, such as, for example, improved parametric characteristics and/or lifetime, and reduced bowing, warping, and/or distortion.

BRIEF DESCRIPTION OF THE DRAWINGS

To facilitate further description of the embodiments, the following drawings are provided in which.

Figure 1:
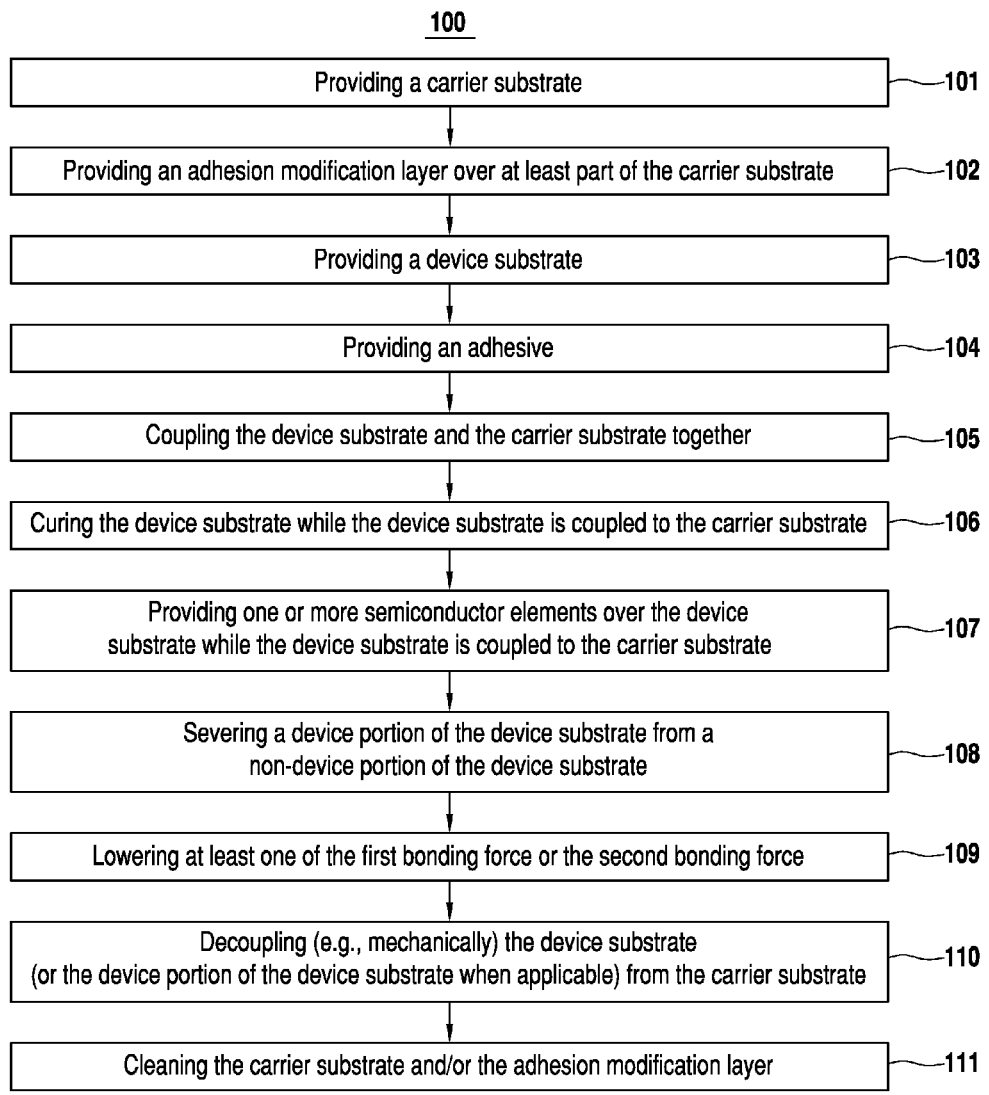
FIG. 1 illustrates a flow chart for an embodiment of a method of providing a semiconductor device.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

The term "bowing" as used herein means the curvature of a substrate about a median plane, which is parallel to the top and bottom sides, or major surfaces of the substrate. The term "warping" as used herein means the linear displacement of the surface of a substrate with respect to a z-axis, which is perpendicular to the top and bottom sides, or major surfaces of the substrate. The term "distortion" as used herein means the displacement of a substrate in-plane (i.e., the x-y plane, which is parallel to the top and bottom sides, or major surfaces of the substrate). For example, distortion could include shrinkage in the x-y plane of a substrate and/or expansion in the x-y plane of the substrate.

The term "CTE matched material" and the like as used herein means a material that has a coefficient of thermal expansion (CTE) which differs from the CTE of a reference material by less than about 20 percent (%). Preferably, the CTEs differ by less than about 10%, 5%, 3%, or 1%.

The term "flexible substrate" as used herein means a free-standing substrate that readily adapts its shape. Accordingly, in many embodiments, the flexible substrate can comprise (e.g., consist of) a flexible material, and/or can comprise a thickness (e.g., an average thickness) that is sufficiently thin so that the substrate readily adapts in shape. In these or other embodiments, a flexible material can refer to a material having a low elastic modulus. Further, a low elastic modulus can refer to an elastic modulus of less than approximately five GigaPascals (GPa). In some embodiments, a substrate that is a flexible substrate because it is sufficiently thin so that it readily adapts in shape, may not be a flexible substrate if implemented with a greater thickness, and/or the substrate may have an elastic modulus exceeding five GPa. For example, the elastic modulus could be greater than or equal to approximately five GPa but less than or equal to approximately twenty GPa, fifty GPa, seventy GPa, or eighty GPa. In some embodiments, exemplary materials for a substrate that is a flexible substrate because it is sufficiently thin so that it readily adapts in shape, but that may not be a flexible substrate if implemented with a greater thickness, can comprise certain glasses (e.g., fluorosilicate glass, borosilicate glass, Corning® glass, Willow™ glass, and/or Vitrelle glass, etc., such as, for example, as manufactured by Corning Inc. of Corning, N.Y., United States of America, etc.) or silicon having a thickness greater than or equal to approximately 25 micrometers and less than or equal to approximately 100 micrometers.

Meanwhile, the term "rigid substrate" as used herein can mean a free-standing substrate that does not readily adapt its shape and/or a substrate that is not a flexible substrate. In some embodiments, the rigid substrate can be devoid of flexible material and/or can comprise a material having an elastic modulus greater than the elastic modulus of a flexible substrate. In various embodiments, the rigid substrate can be implemented with a thickness that is sufficiently thick so that the substrate does not readily adapt its shape. In these or other examples, the increase in rigidity of the carrier substrate provided by increasing the thickness of the carrier substrate can be balanced against the increase in cost and weight provided by increasing the thickness of the carrier substrate.

As used herein, "polish" can mean to lap and polish a surface or to only lap the surface.

DETAILED DESCRIPTION OF EXAMPLES OF EMBODIMENTS

Some embodiments include a method. The method can comprise: providing a carrier substrate; providing an adhesion modification layer over the carrier substrate; providing a device substrate; and coupling the device substrate and the carrier substrate together, the adhesion modification layer being located between the device substrate and the carrier substrate when the device substrate and the carrier substrate are coupled together. In these embodiments, the adhesion modification layer can be configured so that the device substrate couples indirectly with the carrier substrate by way of the adhesion modification layer with a first bonding force that is greater than a second bonding force by which the device substrate couples with the carrier substrate absent the adhesion modification layer.

Other embodiments include a method. The method can comprise: providing a carrier substrate; providing an adhesion modification layer over the carrier substrate; providing an adhesive; providing a device substrate comprising a first surface and a second surface opposite the first surface; coupling the first surface of the device substrate and the carrier substrate together with the adhesive, the adhesion modification layer being located between the first surface of the device substrate and the carrier substrate when the first surface of the device substrate and the carrier substrate are coupled together; after coupling the first surface of the device substrate and the carrier substrate together, providing one or more semiconductor elements over the second surface of the device substrate while the device substrate and the carrier substrate are coupled together; and after providing the one or more semiconductor elements over the second surface of the device substrate, mechanically decoupling the first surface of the device substrate from the carrier substrate such that no more than 5 percent of the adhesive remains at the first surface of the device substrate immediately after the decoupling.

Further embodiments include a method. The method can comprise: providing a carrier substrate comprising a first surface and a second surface opposite the first surface; providing a device substrate comprising a first surface and a second surface opposite the first surface; treating at least part of the second surface of the carrier substrate to increase a force with which the first surface of the device substrate couples to the at least the part of the second surface of the carrier substrate; and coupling the first surface of the device substrate and the second surface of the carrier substrate together.

Turning to the drawings, FIG. 1 illustrates a flow chart for an embodiment of method 100. Method 100 is merely exemplary and is not limited to the embodiments presented herein. Method 100 can be employed in many different embodiments or examples not specifically depicted or described herein. In some embodiments, the activities of method 100 can be performed in the order presented. In other embodiments, the activities of method 100 can be performed in any other suitable order. In still other embodiments, one or more of the activities in method 100 can be combined or skipped.

In many embodiments, method 100 can comprise a method of providing (e.g., manufacturing) an electronic device. Although the electronic device can comprise any suitable electronic device, in many embodiments, the electronic device can comprise an electronic display, an x-ray sensor, a biological sensor, a battery, etc. Generally speaking, coupling a device substrate of the electronic device to a carrier substrate when one or more semiconductor elements of the electronic device are being provided over the device substrate can facilitate providing the electronic device. For example, in some embodiments, when the device substrate comprises a flexible substrate and the carrier substrate comprises a rigid substrate, coupling the device substrate of the electronic device to the carrier substrate can permit the semiconductor element(s) of the electronic device to be provided over the device substrate using semiconductor manufacturing infrastructure configured for processing over rigid substrates. In many embodiments, after the semiconductor element(s) are provided over the device substrate, method 100 can permit the device substrate to be decoupled from the carrier substrate in a manner mitigating or eliminating defects at the electronic device, as discussed in greater detail herein.

Figure 2:
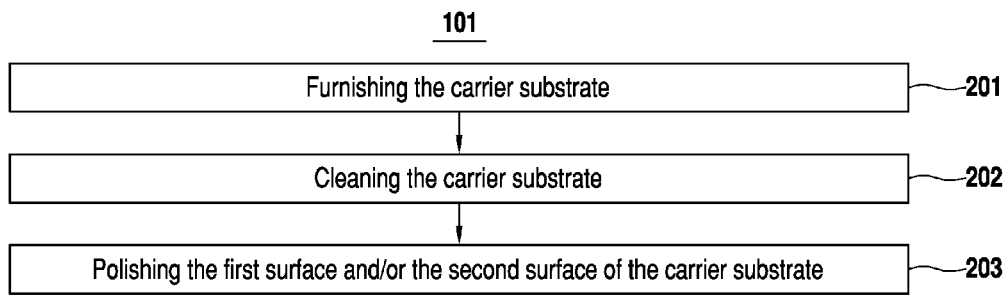
FIG. 2 illustrates an exemplary activity of providing a carrier substrate of the semiconductor device, according to the embodiment of FIG. 1.

For example, method 100 can comprise activity 101 of providing a carrier substrate. FIG. 2 illustrates an exemplary activity 101, according to the embodiment of FIG. 1.

In many embodiments, activity 101 can comprise activity 201 of furnishing the carrier substrate. The carrier substrate can comprise a first surface and a second surface opposite the first surface. The carrier substrate can be configured to minimize bowing, warping, and/or distortion of the device substrate when the device substrate is coupled to the carrier substrate and the adhesion modification layer, as described below.

Accordingly, in many embodiments, the carrier substrate can comprise a rigid substrate. The carrier substrate (e.g., rigid substrate) can comprise any suitable material(s) having the characteristics of a rigid substrate as defined above. Specifically, exemplary material(s) can comprise alumina ($Al_2O_3$), silicon, glass (e.g., barium borosilicate, soda lime silicate, and/or an alkali silicate), metal, metal alloy (e.g., steel, such as, for example, stainless steel), and/or sapphire. However, in some embodiments, the carrier substrate (e.g., rigid substrate) can be devoid of silicon and/or amorphous silicon. Meanwhile, in many embodiments, the glass can comprise a low CTE glass.

Further, material(s) for the carrier substrate (e.g., rigid substrate) also can be selected so that a CTE of the material(s) approximately matches a CTE of the material(s) of the device substrate and/or the adhesion modification layer, each of which is introduced briefly above and described in greater detail below. Likewise, in some embodiments, material(s) for the device substrate and/or adhesion modification layer can be selected so as to be CTE matched with the material(s) of the carrier substrate, and/or with each other. Non-matched CTEs can create stress between the carrier substrate, the device substrate and/or the adhesion modification layer.

Meanwhile, in many embodiments, the carrier substrate can be a wafer or panel. The carrier substrate (e.g., the wafer or panel) can comprise any suitable dimensions. For example, the carrier substrate (e.g., the wafer or panel) can comprise any suitable largest dimension (e.g., diameter), such as, for example, approximately 6 inches (approximately 15.24 centimeters), approximately 8 inches (approximately 20.32 centimeters), approximately 12 inches (approximately 30.48 centimeters), or approximately 18 inches (approximately 45.72 centimeters). In some embodiments, the carrier substrate can be a panel of approximately 370 millimeters by approximately 470 millimeters, of approximately 400 millimeters by approximately 500 millimeters, of approximately 620 millimeters by approximately 750 millimeters, of approximately 730 millimeters by approximately 920 millimeters, of approximately 1,000 millimeters by approximately 1,200 millimeters, of approximately 1,000 millimeters by approximately 1,300 millimeters, of approximately 1,300 millimeters by approximately 1,500 millimeters, of approximately 1,500 millimeters by approximately 1,850 millimeters, of approximately 1,870 millimeters by approximately 2,200 millimeters, of approximately 1,950 millimeters by approximately 2,250 millimeters, of approximately 2,160 millimeters by approximately 2,460 millimeters, of approximately 2,200 millimeters by approximately 2,500 millimeters, or of approximately 2,880 millimeters by approximately 3,130 millimeters. In some embodiments, the carrier substrate (e.g., the wafer or panel) can comprise a carrier substrate thickness. The carrier substrate thickness can refer to a dimension of the carrier substrate measured in a direction approximately perpendicular to the first and second surfaces of the carrier substrate. For example, the carrier substrate thickness can be greater than or equal to approximately 300 micrometers and less than or equal to approximately 2 millimeters. In these or other embodiments, the carrier substrate thickness can be greater than or equal to approximately 0.5 millimeters. In many embodiments, the carrier substrate thickness can be approximately constant.

Later, in some embodiments, activity 101 can comprise activity 202 of cleaning the carrier substrate. In some embodiments, activity 202 can be performed by cleaning the carrier substrate with plasma (e.g., oxygen plasma) or with an ultrasonic bath.

Then, activity 101 can comprise activity 203 of polishing the first surface and/or the second surface of the carrier substrate. Polishing the surface of the carrier substrate (e.g., the first surface) that is not subsequently coupled (e.g., bonded) with the adhesion modification layer, as described below, improves the ability of a vacuum or air chuck to handle the carrier substrate. Also, polishing the surface of the carrier substrate (e.g., the second surface) that is subsequently coupled (e.g., bonded) to the adhesion modification layer, as described below, removes topological features at that surface of the carrier substrate that could cause roughness of the resulting device substrate assembly in the z-axis after the device substrate and carrier substrate are coupled together.

Next, returning to FIG. 1, method 100 can comprise activity 102 of providing an adhesion modification layer over at least part of the carrier substrate, such as, for example, over at least part (e.g., all) of the second surface of the carrier substrate. Like the carrier substrate, the adhesion modification layer can comprise a first surface and a second surface opposite the first surface. In these embodiments, the first surface of the adhesion modification layer can be located adjacent to the second surface of the carrier substrate.

Figure 3:
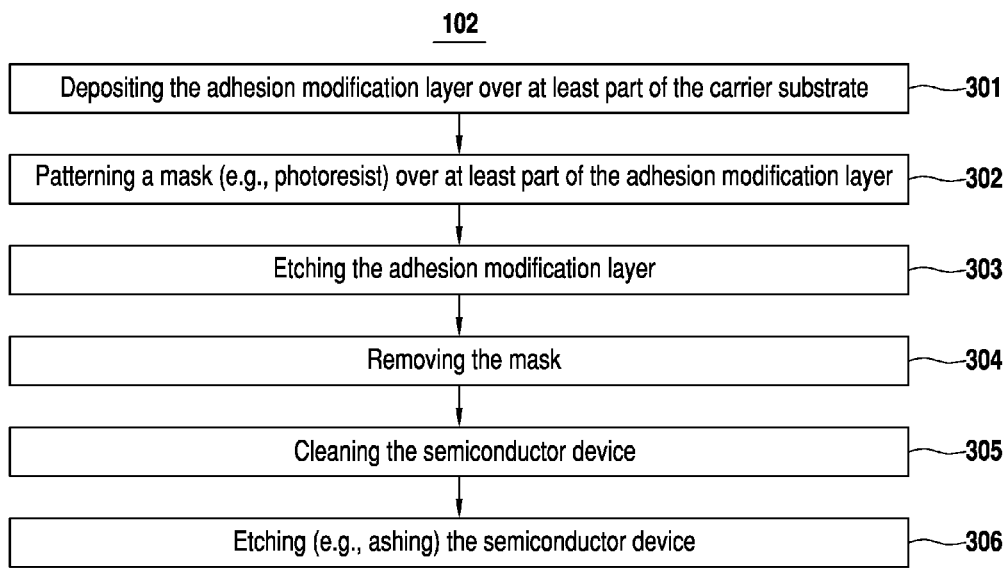
FIG. 3 illustrates an exemplary activity of providing an adhesion modification layer of the semiconductor device over at least part of the carrier substrate, according to the embodiment of FIG. 1.

As explained below, in various embodiments, the adhesion modification layer can comprise any suitable material(s) (e.g., amorphous silicon, silicon nitride, silicon dioxide, and/or 3-Methacryloxyproply-trimethoxysilane, etc.), able to bond to the device substrate, and/or to an adhesive bonding the device substrate to the adhesion modification layer, as described below, with a bonding force (i.e., a first bonding force) that is greater than a bonding force (i.e., a second bonding force) between the carrier substrate and the device substrate and/or the adhesive directly. As a result, the adhesion modification layer is operable as an intermediate layer configured so that the device substrate couples indirectly with the carrier substrate by way of the adhesion modification layer with a greater bonding force than would be possible absent the adhesion modification layer. Accordingly, in some examples, activity 102 can be performed as part of an activity of treating at least part of the second surface of the carrier substrate to increase a force (i.e., to the first bonding force) with which the first surface of the device substrate couples to the at least the part of the second surface of the carrier substrate (i.e., the second bonding force). FIG. 3 illustrates an exemplary activity 102, according to the embodiment of FIG. 1.

Activity 102 can comprise activity 301 of depositing the adhesion modification layer over at least part of the carrier substrate, such as, for example, over at least part (e.g., all) of the second surface of the carrier substrate. In other embodiments, activity 301 can be substituted with an activity of depositing the adhesion modification layer at a first surface of the device substrate. In either implementation, the depositing can be performed via chemical vapor deposition (e.g., plasma-enhanced chemical vapor deposition). For example, in many embodiments, the adhesion modification layer can be deposited over the carrier substrate (e.g., at least part or all or substantially all of the second surface of the carrier substrate) under one or more predetermined conditions. Exemplary conditions for the deposition can comprise a pressure of approximately 0.267 kPa, a power density of approximately 170 mW/cm$^2$, a silane flow of approximately 100 standard cubic centimeters per minute, a hydrogen flow of approximately 3000 standard cubic centimeters per minute, and susceptor spacing of approximately 2.44 centimeters.

The adhesion modification layer can be provided (e.g., deposited) to comprise a thickness (i.e., a dimension of the adhesion modification layer that is approximately perpendicular to the second surface of the carrier substrate when the adhesion modification layer is provided over the carrier substrate). In many embodiments, the thickness can be approximately constant across the second surface of the carrier substrate. In some embodiments, the thickness can be greater than or equal to approximately 0.05 micrometers and less than or equal to approximately 25 micrometers, such as, for example, approximately 0.3 micrometers. Generally, the thickness can be selected to be thick enough to ensure continuous distribution of the adhesion modification layer over the carrier substrate. Further, the thickness can be selected to be as thin as possible, while still permitting the carrier substrate, to minimize bowing, warping, and/or distortion of the device substrate when the device substrate is coupled to the carrier substrate and/or the adhesion modification layer, as described below.

In some embodiments, activity 102 can comprise activity 302 of patterning a mask (e.g., photoresist) over at least part of the adhesion modification layer (e.g., at least part of the second surface of the adhesion modification layer). The mask can cover one or more portions of the adhesion modification layer that are not to be etched. For example, the mask can be patterned over a perimeter portion of the second surface of the adhesion modification layer, leaving a central portion of the second surface of the adhesion modification layer exposed during activity 303 as described below.

In these embodiments, the perimeter portion of the carrier substrate can refer to a portion of the second surface of the carrier substrate located between the edge of the carrier substrate and a perimeter of the carrier substrate. The perimeter can refer to a continuous reference line located at the second surface of the carrier substrate at a predetermined distance from the edge of the carrier substrate. The predetermined distance can be selected to be as small as possible to maximize the device build surface for the semiconductor devices while being large enough to correspond to the portions of the carrier surface that will be handled during fabrication of the semiconductor devices. Meanwhile, the central portion of the adhesion modification layer can refer to a remaining portion of the second surface of the carrier substrate corresponding to the device build surface for the semiconductor devices.

The mask can be provided with a thickness such that the mask is not etched through during activity 303 as described below. In some examples, the mask can have a thickness of greater than or equal to approximately 2.5 micrometers and less than or equal to approximately 5.0 micrometers, such as, for example, approximately 3.5 micrometers.

In some embodiments, activity 302 can be performed by coating the second surface of the adhesion modification layer with photoresist. Next, the adhesion modification layer can be aligned with a template and the photoresist can be exposed to ultraviolet light to transfer a mask image from the template to the photoresist. After transferring the mask image, the photoresist can be baked. The mask can then be developed by using conventional development chemicals to remove the portions of the photoresist that were not exposed to the UV light as a result of the template.

Next, activity 102 can comprise activity 303 of etching the adhesion modification layer (e.g., the unmasked portion(s) of the adhesion modification layer). In many embodiments, activity 303 can be performed by reactive ion etching or wet etching the adhesion modification layer. In some examples, the adhesion modification layer can be etched with a buffered oxide etchant, a chlorine-based etchant, or a fluorine-based etchant.

Meanwhile, after activity 303, activity 102 can comprise activity 304 of removing the mask. In some examples, activity 304 can be performed by dissolving the mask with a solvent etch including one or more solvents, such as, for example, acetone, n-methylpyrrolidonem, aminopropylmorpholine, dimethyl sulfoxide, aminopropanol, and/or sulfolane, etc. In these or other examples, the solvent etch can be performed with a stationary bath, a recirculating bath, or a spray coater at 70° C. Then, the carrier substrate with the remaining portion of the adhesion modification layer can be rinsed with deionized water and spin dried or air knife dried. In some examples, the rinsing can be performed in a quick dump rinser, and the drying can be performed in a spin rinse dryer.

In many embodiments, activities 302-304 can be omitted. In some embodiments, whether or not activities 302-304 are performed can depend on the material(s) implemented for the device substrate, as described below. For example, when the device substrate comprises polyimide, it may be desirable to perform activities 302-304. Meanwhile, when the device substrate comprises polyethylene naphthalate, it may be desirable to omit activities 302-304.

Activity 102 can comprise activity 305 of cleaning the carrier substrate having the remaining portion of the adhesion modification layer. Activity 305 can be performed by rinsing the carrier substrate with the remaining portion of the adhesion modification layer with deionized water and spin drying the carrier substrate with the remaining portion of the adhesion modification layer. In some examples, the rinsing can be performed in a quick dump rinser, and the drying can be performed in a spin rinse dryer. In some embodiments, activity 305 can be omitted or can be performed as part of activity 304.

Further, activity 102 can comprise activity 306 of etching (e.g., ashing) the carrier substrate with the remaining portion of the adhesion modification layer. Activity 306 can be performed with an oxygen plasma etch. In some embodiments, the oxygen plasma etch can be performed at a pressure of approximately 1200 mTorr for 90 minutes. In some embodiments, activity 306 can be omitted.

Figure 4:
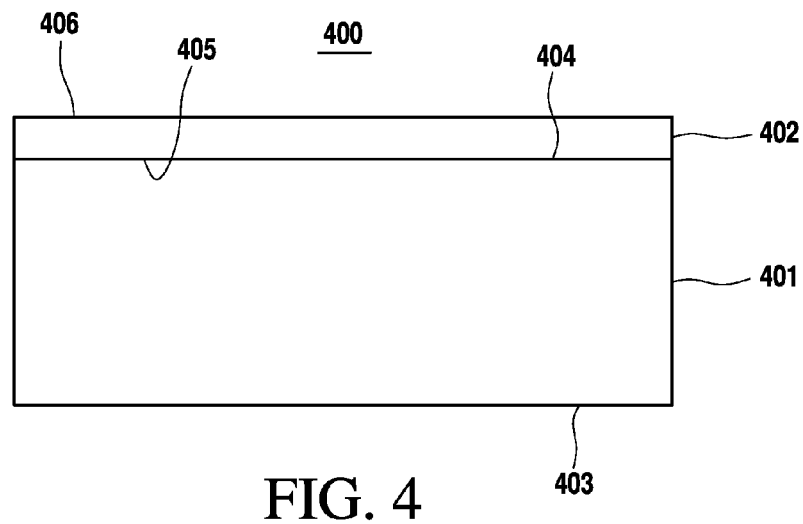
FIG. 4 illustrates a partial cross-sectional view of a semiconductor device after providing an adhesion modification layer over the carrier substrate, according to an embodiment.

Turning ahead briefly in the drawings, FIG. 4 illustrates a partial cross-sectional view of semiconductor device 400 after providing adhesion modification layer 402 over carrier substrate 401, according to an embodiment. Semiconductor device 400 can be similar or identical to the semiconductor device of method 100 (FIG. 1). Further, carrier substrate 401 and/or adhesion modification layer 402 can be similar or identical to the carrier substrate and/or adhesion modification layer of method 100 (FIG. 1), respectively. Accordingly, carrier substrate 401 can comprise first surface 403 and second surface 404 opposite of first surface 403. Likewise, adhesion modification layer 402 can comprise first surface 405 and second surface 406 opposite of first surface 405.

Figure 5:
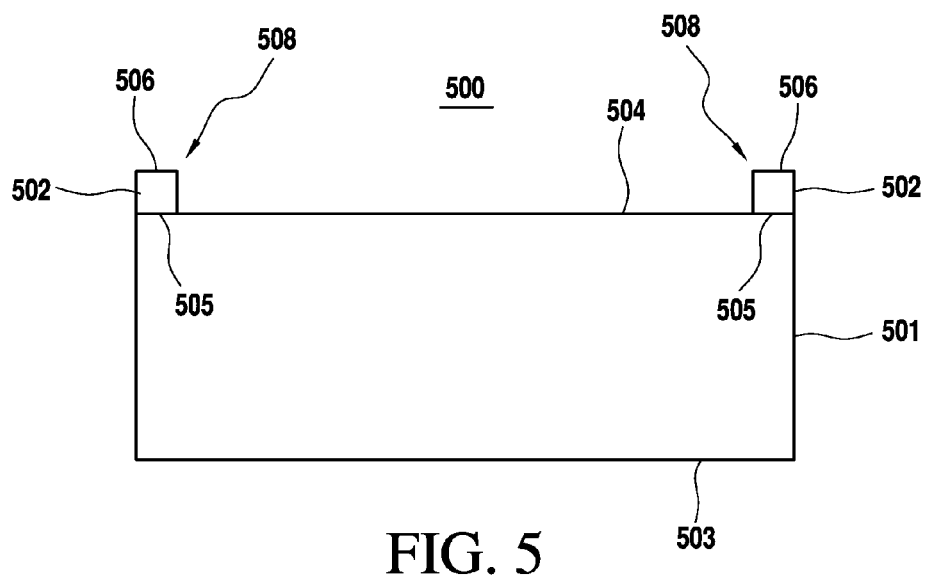
FIG. 5 illustrates a partial cross-sectional view of a semiconductor device where a central portion of an adhesion modification layer of the semiconductor device has been removed by etching to leave a perimeter portion of the adhesion modification layer and to expose the carrier substrate, according to an embodiment.

Meanwhile, FIG. 5 illustrates a partial cross-sectional view of semiconductor device 500, according to an embodiment. Semiconductor device 500 can be similar or identical to semiconductor device 400 except that a central portion of adhesion modification layer 502 has been removed by etching to leave perimeter portion 508 of adhesion modification layer 502 and to expose carrier substrate 501. Carrier substrate 501 can be similar or identical to carrier substrate 401 (FIG. 4) and/or the carrier substrate of method 100 (FIG. 1); adhesion modification layer 502 can be similar or identical to adhesion modification layer 402 (FIG. 4) and/or the adhesion modification layer of method 100 (FIG. 1); and central portion 507 and/or perimeter portion 508 can be similar or identical to the central portion and/or perimeter portion of the adhesion modification layer of method 100 (FIG. 1), respectively. Accordingly, carrier substrate 501 can comprise first surface 503 and second surface 504 opposite of first surface 503. Likewise, adhesion modification layer 502 can comprise first surface 505 and second surface 506 opposite of first surface 505.

Referring now back to FIG. 1, method 100 can comprise activity 103 of providing a device substrate. Like the carrier substrate, the device substrate can comprise a first surface and a second surface opposite the first surface.

In many embodiments, the device substrate can comprise a flexible substrate. The device substrate (e.g., flexible substrate) can comprise any suitable material(s) having the characteristics of a flexible substrate as defined above. Specifically, exemplary material(s) can comprise polyethylene naphthalate, polyethylene terephthalate, polyethersulfone, polyimide, polycarbonate, cyclic olefin copolymer, liquid crystal polymer, any other suitable polymer, glass (fluorosilicate glass, borosilicate glass, Corning® glass, Willow™ glass, and/or Vitrelle glass, etc., such as, for example, as manufactured by Corning Inc. of Corning, N.Y., United States of America, etc.), metal foil (e.g., aluminum foil, etc.), etc.

In some embodiments, activity 103 can be performed by furnishing the device substrate. In other embodiments, activity 103 can be performed by depositing the device substrate over the carrier substrate and over the adhesion modification layer (e.g., at the second surface of the adhesion modification layer), such as, for example, as part of activity 701 (FIG. 7) as described below.

Further, in some embodiments, method 100 can comprise activity 104 of providing an adhesive, such as, for example, (i) over the carrier substrate and over the adhesion modification layer (e.g., at the second surface of the adhesion modification layer) and/or (ii) at the first surface of the device substrate. The adhesive can comprise any material(s)

configured to bond with greater bonding force to the adhesion modification layer than to the carrier substrate. In many examples, the adhesive can comprise an acrylate polymer adhesive. In some embodiments, activity 104 can be omitted, such as, for example, when activity 701 (FIG. 7) is performed.

In various embodiments, activity 104 can be performed by depositing the adhesive over the adhesion modification layer (e.g., at the second surface of the adhesion modification layer) and/or at the first surface of the device substrate, such as, for example, via spin-coating, spray-coating, extrusion coating, preform lamination, slot die coating, screen lamination, screen printing, and/or vapor priming. In these or other embodiments, the adhesive can be deposited over the adhesion modification layer (e.g., at the second surface of the adhesion modification layer) and/or at the first surface of the device substrate under one or more predetermined conditions.

In specific examples, the adhesive can be deposited while spinning the carrier substrate having the adhesion modification layer first at a spin rate of approximately 1,000 revolutions per minute for a time of approximately 25 seconds. Then, the carrier substrate and adhesion modification layer can be held stationary for a time (e.g., approximately 10 seconds) before spinning the carrier substrate and the adhesion modification layer for a time of approximately 20 seconds at a spin rate of approximately 3,500 revolutions per minute.

Figure 6:
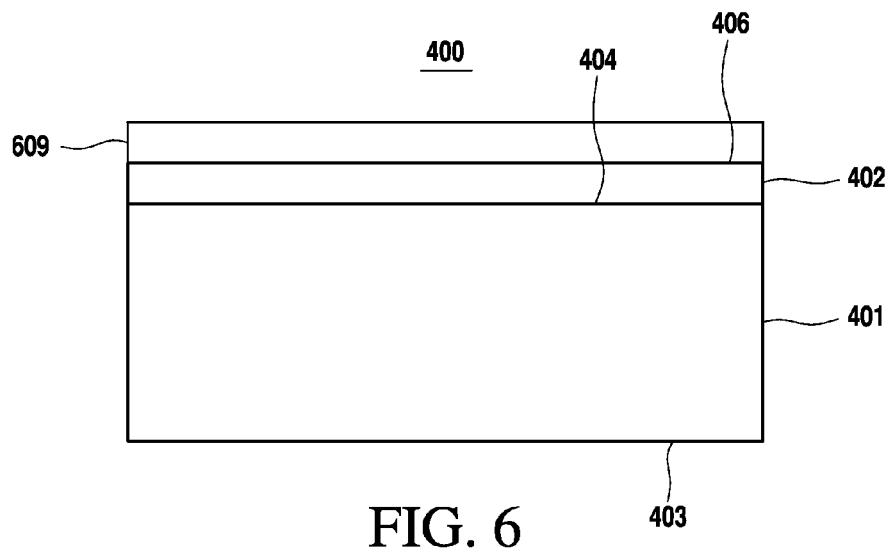
FIG. 6 illustrates a partial cross-sectional view of the semiconductor device after providing an adhesive over the carrier substrate and over the adhesion modification layer, according to the embodiment of FIG. 4.

Turning ahead in the drawings, FIG. 6 illustrates a partial cross-sectional view of semiconductor device 400 after providing adhesive 609 over carrier substrate 401 and over adhesion modification layer 402 (e.g., at second surface 406 of adhesion modification layer 402), according to the embodiment of FIG. 4.

Figure 7:
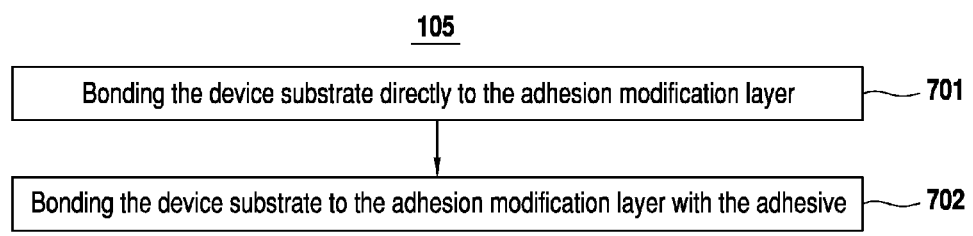
FIG. 7 illustrates an exemplary activity of coupling the device substrate and the carrier substrate together, according to the embodiment of FIG. 1.

Turn again back to FIG. 1, method 100 can comprise activity 105 of coupling the device substrate and the carrier substrate together. In these embodiments, activity 105 can be performed such that the adhesion modification layer is located between the device substrate and the carrier substrate when the device substrate and the carrier substrate are coupled together. Accordingly, in many embodiments, activity 105 can be performed after activity 102 and/or activity 301 (FIG. 3). FIG. 7 illustrates an exemplary activity 105, according to the embodiment of FIG. 1.

Figure 8:
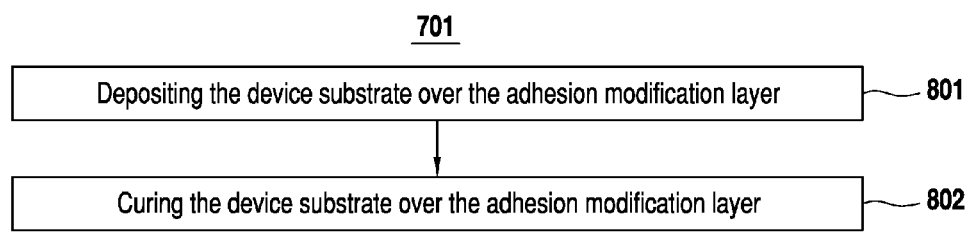
FIG. 8 illustrates an exemplary activity of bonding the device substrate directly to the adhesion modification layer, according to the embodiment of FIG. 7.

In some embodiments, activity 105 can comprise activity 701 of bonding the device substrate directly to the adhesion modification layer. FIG. 8 illustrates an exemplary activity 701, according to the embodiment of FIG. 7.

Activity 701 can comprise activity 801 of depositing the device substrate over the adhesion modification layer (e.g., at the second surface of the adhesion modification layer), such as, for example, via spin-coating, spray-coating, extrusion coating, preform lamination, slot die coating, screen lamination, screen printing, and/or vapor priming. In these or other embodiments, the device substrate can be deposited over the adhesion modification layer (e.g., at the second surface of the adhesion modification layer) under one or more predetermined conditions.

In some embodiments, the predetermined conditions can be dependent on a desired device substrate thickness, as discussed below. In specific examples, the device substrate can be deposited while spinning the carrier substrate at a spin rate greater than or equal to approximately 500 revolutions per minute and less than or equal to approximately 6,000 revolutions per minute for a time of greater than or equal to approximately 10 seconds and less than or equal to approximately 100 seconds. For example, the spin rate can be approximately 1,000 revolutions per minute and/or the time can be approximately 25 seconds.

In many embodiments, activity 701 can comprise activity 802 of curing the device substrate over the adhesion modification layer (e.g., at the second surface of the adhesion modification layer). For example, the curing can occur first by a hot plate bake for approximately 10 minutes at approximately 90° C. to approximately 150° C. following by a convention oven bake at approximately 220° C. for approximately one hour. In many embodiments, activity 802 can help to remove from the device substrate chemistry (e.g., solvents) used to perform activity 801 as described above. In these or other embodiments, activity 802 can help to bond the device substrate to the adhesion modification layer. The device substrate can be thermally cured and/or optically cured, as desirable. In some embodiments, activity 802 can be omitted.

Figure 9:
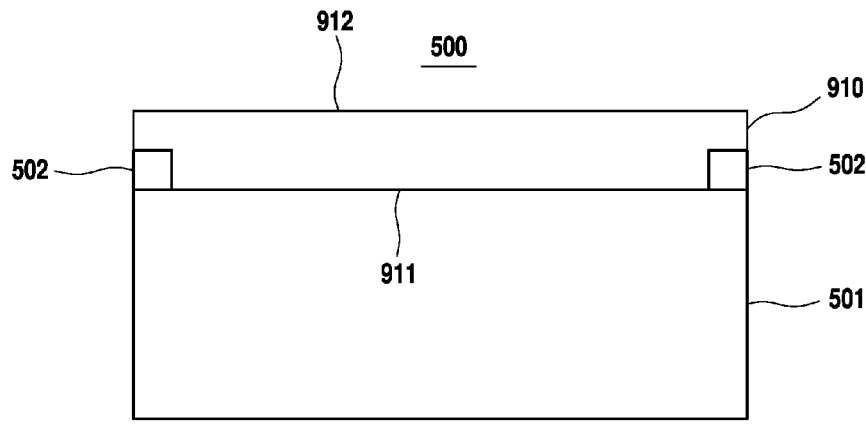
FIG. 9 illustrates a partial cross-sectional view of the semiconductor device after bonding a device substrate directly to the adhesion modification layer and over the carrier substrate, according to the embodiment of FIG. 5.

Turning ahead briefly in the drawings, FIG. 9 illustrates a partial cross-sectional view of semiconductor device 500 after bonding device substrate 910 directly to adhesion modification layer 502 and over carrier substrate 501, according to the embodiment of FIG. 5. Device substrate 910 can be similar or identical to the device substrate described above with respect to method 100 (FIG. 1). Accordingly, device substrate 910 can comprise first surface 911 and second surface 912 opposite of first surface 911. First surface 911 can be similar or identical to the first surface of the device substrate of method 100 (FIG. 1), and second surface 912 can be similar or identical to the second surface of the device substrate of method 100 (FIG. 1).

Figure 10:
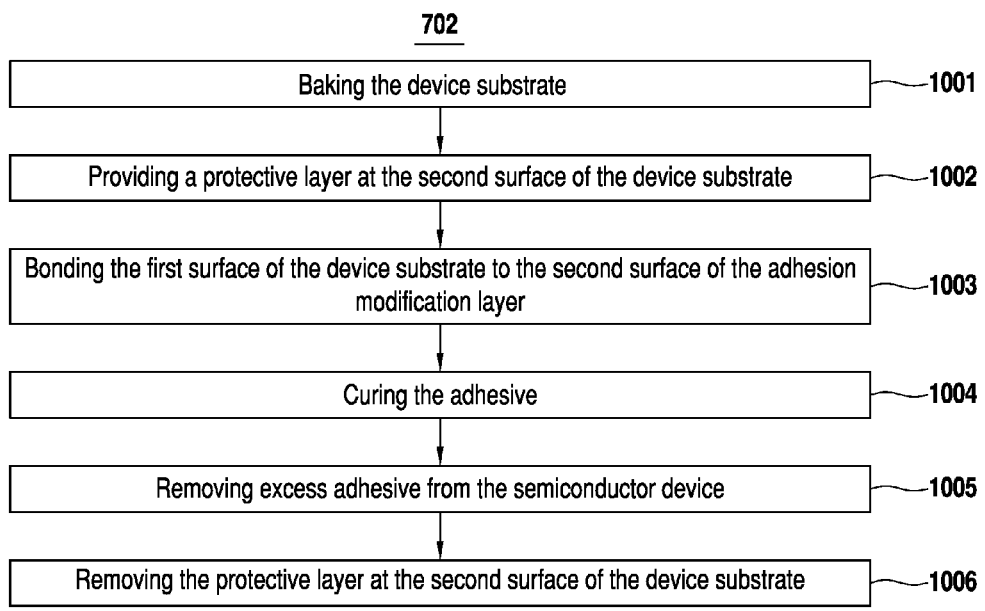
FIG. 10 illustrates an exemplary activity of bonding the device substrate to the adhesion modification layer with the adhesive, according to the embodiment of FIG. 7.

Returning now back to FIG. 7, in other embodiments, activity 105 can comprise activity 702 of bonding the device substrate to the adhesion modification layer with the adhesive. Accordingly, when method 100 is implemented with activity 702, activity 104 (FIG. 1) is performed. Notably, in many embodiments, activity 702 can be omitted when activity 701 is performed, and vice versa. FIG. 10 illustrates an exemplary activity 702, according to the embodiment of FIG. 7.

In some embodiments, activity 702 can comprise activity 1001 of baking the device substrate. In these or other embodiments, the device substrate can be baked under one or more predetermined conditions. In many examples, the device substrate can be baked under vacuum conditions and/or at a temperature of greater than or equal to approximately 100° C. and less than or equal to approximately 200° C. Generally, activity 1001 can be performed before activities 1002-1006. In some embodiments, activity 1001 can be omitted.

In many embodiments, activity 702 can comprise activity 1002 of providing a protective layer at the second surface of the device substrate. In many embodiments, the protective layer can comprise tape (e.g., Blue Low Tack Squares, product number 18133-7.50, manufactured by Semiconductor Equipment Corporation of Moorpark, Calif.). Performing activity 802 can prevent damage to and/or contamination of the second surface of the device substrate when performing activity 1003 as described below.

After activity 1002, activity 702 can continue with activity 1003 of bonding the first surface of the device substrate to the second surface of the adhesion modification layer. Activity 1003 can be performed using any suitable lamination technique (e.g., roll pressing, bladder pressing, etc.). In many embodiments, activity 1003 can be performed under one or more predetermined conditions. In many examples, activity 1003 can be performed at a pressure of greater than or equal to approximately 34 kPa and less than or equal to approximately 207 kPa, at a temperature of greater than or equal to approximately 80° C. and less than or equal to approximately 140° C., and/or at a feed rate of approximately 0.45 meters per minute.

For example, the first surface of the device substrate can be bonded to the second surface of the adhesion modification layer at a pressure greater than or equal to approximately 0 kilopascals (i.e., in a vacuum) and less than or equal to approximately 150 kilopascals. In some embodiments, the pressure can comprise approximately 138 kilopascals. Further, the first surface of the device substrate can be bonded to the second surface of the adhesion modification layer at a feed rate greater than or equal to approximately 0.1 meters per minute and less than or equal to approximately 1.0 meters per minute in other embodiments. In some embodiments, the feed rate can comprise 0.46 meters per minute. Further still, the first surface of the device substrate can be bonded to the second surface of the adhesion modification layer at a temperature greater than or equal to approximately 20° C. and less than or equal to approximately 100° C., 160° C., 220° C., 350° C., etc. depending on the material(s) of the device substrate. For example, the temperature can be less than or equal to approximately 220° C. (e.g., approximately 100° C.) when the device substrate comprises polyethylene naphthalate, can be less than or equal to approximately 160° C. (e.g., approximately 100° C.) when the device substrate comprises polyethylene terephthalate, and less than or equal to approximately 350° C. (e.g., approximately 100° C.) when the device substrate comprises polyimide.

In many embodiments, activity 702 can comprise activity 1004 of curing the adhesive. Activity 1004 can be performed using any suitable technique(s) for curing the adhesive (e.g., optical curing, heat curing, pressure curing, etc.) without damaging the carrier substrate, the adhesion modification layer, or the device substrate. For example, in some embodiments, activity 1005 can be performed by ultraviolet curing the adhesive, such as, for example, using a Dymax ultraviolet cure system manufactured by Dymax Corporation of Torrington, Conn. In these embodiments, activity 1004 can be performed for approximately 20 seconds to approximately 180 seconds. In other embodiments, activity 1004 can be performed by baking the adhesive in an oven, such as, for example, a Yamato Oven manufactured by Yamato Scientific America, Inc. of Santa Clara, Calif.

After activity 1003 and/or activity 1004, activity 702 can comprise activity 1005 of removing excess adhesive from the semiconductor device. In some embodiments, activity 1005 can be performed by cleaning the carrier substrate with plasma (e.g., oxygen plasma) or with an ultrasonic bath.

After activity 1003, activity 702 can comprise activity 1006 of removing the protective layer at the second surface of the device substrate. In some embodiments, activities 1002 and 1005 can be omitted. In various embodiments, activity 1006 can be performed as part of activity 1005.

Figure 11:
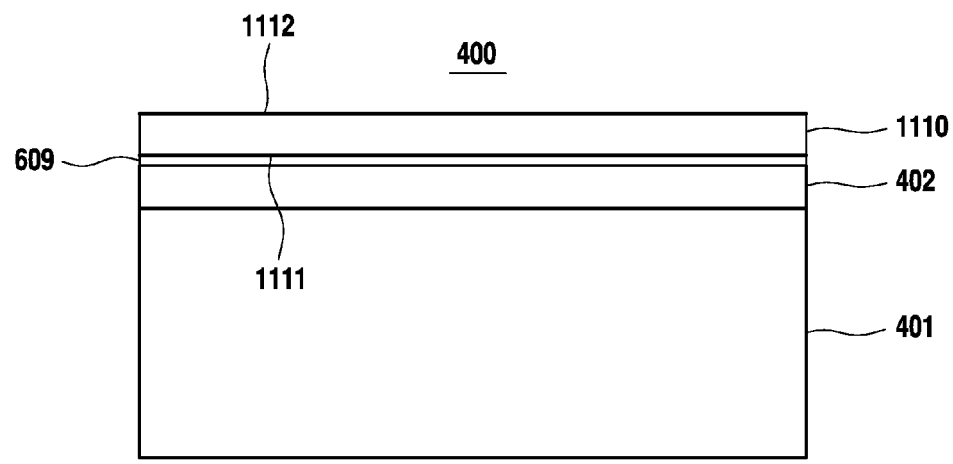
FIG. 11 illustrates a partial cross-sectional view of the semiconductor device after bonding the device substrate to the adhesion modification layer with the adhesive and over carrier substrate, according to the embodiment of FIG. 4.

Turning ahead in the drawings, FIG. 11 illustrates a partial cross-sectional view of semiconductor device 400 after bonding device substrate 1110 to adhesion modification layer 402 with adhesive 609 and over carrier substrate 401, according to the embodiment of FIG. 4. Device substrate 1110 can be similar or identical to device substrate 910 and/or the device substrate described above with respect to method 100 (FIG. 1). Accordingly, device substrate 1010 can comprise first surface 1111 and second surface 1112 opposite of first surface 1111. First surface 1111 can be similar or identical to first surface 911 (FIG. 9) and/or the first surface of the device substrate of method 100 (FIG. 1), and second surface 912 can be similar or identical to second surface 912 (FIG. 9) and/or the second surface of the device substrate of method 100 (FIG. 1).

Returning now again to FIG. 1, whether implementing method 100 in accordance with activity 701 (FIG. 7) or activity 702 (FIG. 7), the device substrate can be provided to comprise a device substrate thickness (i.e., a dimension of the device substrate over the carrier substrate or the adhesive, as applicable, that is approximately perpendicular to the carrier substrate or adhesive when the device substrate is coupled to the carrier substrate). Notably, for reference purposes, calculation of the device substrate thickness excludes the portion of the device substrate over the perimeter portion of the adhesion modification layer when the central portion of the adhesion modification layer has been removed, which it follows would be less than the device substrate thickness by an amount approximately equal to the adhesion modification layer thickness. In many embodiments, the device substrate thickness can be approximately constant. Likewise, a thickness of the portion of the device substrate over the perimeter portion of the adhesion modification layer can also be approximately constant. In some embodiments, the device substrate thickness can be greater than or equal to approximately 1 micrometer and less than or equal to approximately 1 millimeter. For example, the device substrate thickness can be approximately 20 micrometers. Generally, the device substrate thickness can be selected to be thick enough to ensure continuous distribution of the device substrate over the carrier substrate. Further, the device substrate thickness can be selected to be as thin as possible, while still permitting the foregoing, to minimize bowing, warping, and/or distortion of the device substrate when the device substrate is coupled to the carrier substrate.

After activity 105, method 100 can comprise activity 106 of curing the device substrate while the device substrate is coupled to the carrier substrate. The device substrate can be thermally cured and/or optically cured, as desirable. For example, in many embodiments, first, the device substrate can be thermally cured first in vacuum conditions, at a temperature of greater than or equal to approximately 100° C. and less than or equal to approximately 235° C., and/or for a time of greater than or equal to approximately 1 hour and less than or equal to approximately 8 hours. For example, the temperature can comprise approximately 180° C. or 220° C., and/or the time can comprise approximately 3 hours.

Next, method 100 can comprise activity 107 of providing one or more semiconductor elements over the device substrate while the device substrate is coupled to the carrier substrate. In some embodiments, the semiconductor element(s) can be provided over the device substrate in accordance with any conventional semiconductor manufacturing process that does not exceed a temperature of 200° C. In further embodiments, the semiconductor element(s) can be provided over the device substrate in accordance with any conventional semiconductor manufacturing process that does not exceed a temperature of 235° C. For example, in various embodiments, the semiconductor element(s) can be provided over the device substrate in accordance with the semiconductor manufacturing processes described in (i) U.S. patent application Ser. No. 13/298,451, filed Nov. 17, 2011, which issued as U.S. Pat. No. 8,999,778 on Apr. 7, 2015, (ii) U.S. patent application Ser. No. 14/029,502, which published as United States Patent Application Publication Serial No. 20140008651 on Jan. 9, 2014, and/or (iii) U.S. patent application Ser. No. 14/288,771, which published as United States Patent Application Publication Serial No.

Figure 12:
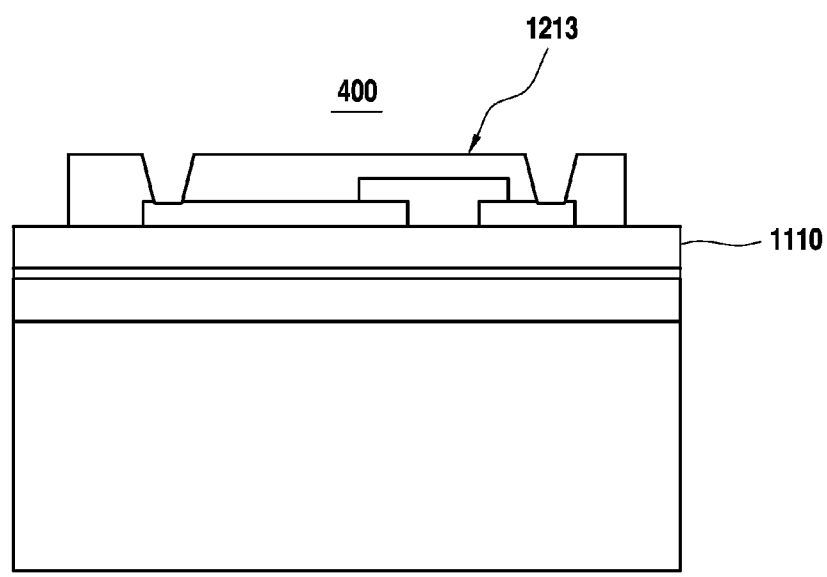
FIG. 12 illustrates a partial cross-sectional view of the semiconductor device after providing one or more semiconductor elements over the device substrate, according to the embodiment of FIG. 4.
Figure 13:
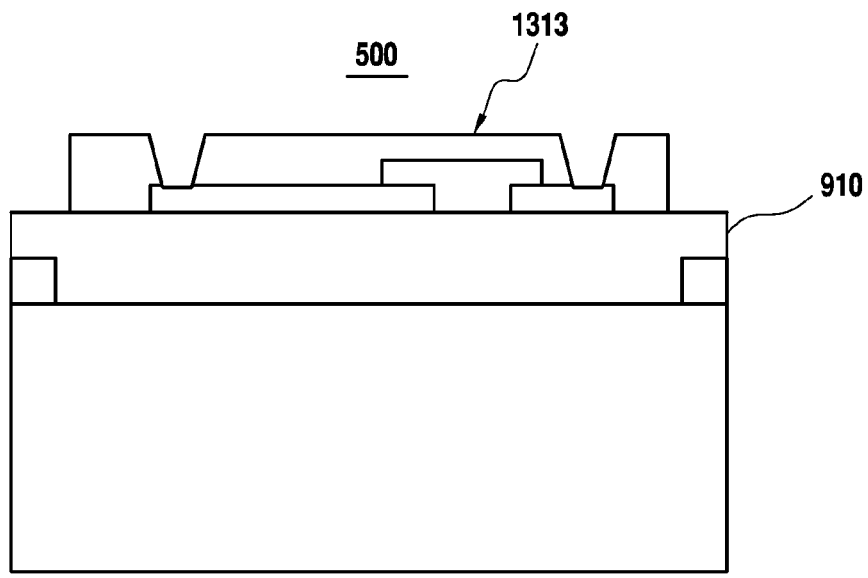
FIG. 13 illustrates a partial cross-sectional view of the semiconductor device after providing one or more semiconductor elements over the device substrate, according to the embodiment of FIG. 5.

20140254113 on Sep. 11, 2014, each of which is incorporated herein by reference in its entirety. In some embodiments, activity 107 can be performed after activity 105. Further, activity 107 can be performed before activity 108 and/or activity 110. FIG. 12 illustrates a partial cross-sectional view of semiconductor device 400 after providing one or more semiconductor elements 1213 over device substrate 1110, according to the embodiment of FIG. 4; and FIG. 13 illustrates a partial cross-sectional view of semiconductor device 500 after providing one or more semiconductor elements 1313 over device substrate 910, according to the embodiment of FIG. 5.

Referring again to FIG. 1, in some embodiments, method 100 can comprise activity 108 of severing a device portion of the device substrate from a non-device portion of the device substrate (e.g., at a location inside the perimeter of the carrier substrate as discussed above with respect to the perimeter portion and the central portion). The non-device portion of the device substrate can be bonded to the adhesion modification layer. Meanwhile, the device portion of the device substrate can be bonded only to the carrier substrate. The device portion comprises at least part of the semiconductor element(s). In some embodiments, the non-device portion can comprise part of the semiconductor element(s). The device portion of the device substrate can be severed from the non-device portion of the device substrate using any suitable cutting implement (e.g., a blade, a laser, etc.). In many embodiments, activity 108 can be performed such that when activity 110 (below) is performed, some or all of the semiconductor element(s) remain with the device portion of the device substrate (e.g., leaving as little of the semiconductor element(s) behind with the non-device portion of the device substrate as possible). In many embodiments, activity 108 can occur after activity 107. Further, activity 108 can occur before activity 110.

Figure 14:
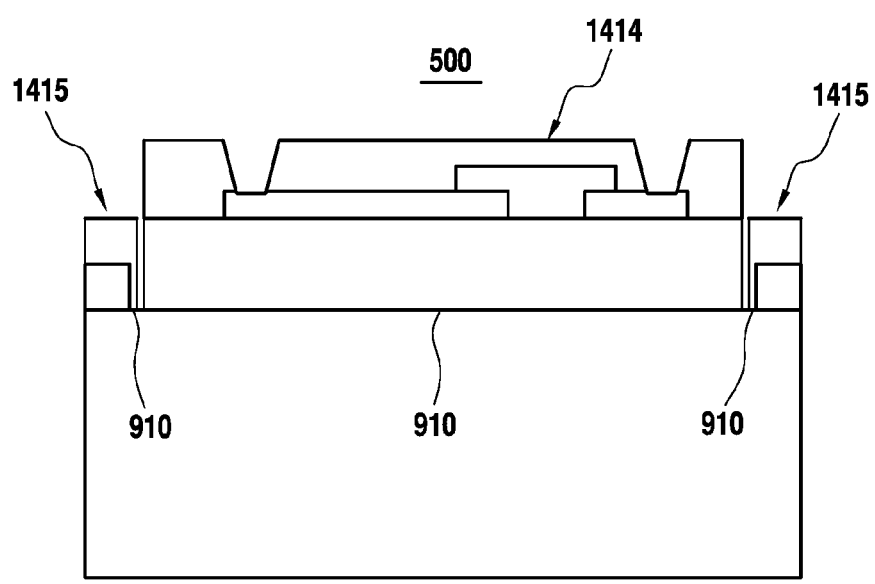
FIG. 14 illustrates a partial cross-sectional view of the semiconductor device after severing a device portion of the device substrate from a non-device portion of the device substrate, according to the embodiment of FIG. 5.

In some embodiments, activity 108 can be omitted, such as, for example, when method 100 is implemented with activity 702 (FIG. 7). In many embodiments, when method 100 is implemented to include activity 701 (FIG. 7) and/or one or more of activities 302-304 (FIG. 3), method 100 can also include activity 108. FIG. 14 illustrates a partial cross-sectional view of semiconductor device 500 after severing device portion 1414 of device substrate 910 from non-device portion 1415 of device substrate 910, according to the embodiment of FIG. 5.

Referring again to FIG. 1, in some embodiments, method 100 can comprise activity 109 of lowering at least one of the first bonding force or the second bonding force. In these embodiments, activity 109 can be performed by chemically, electromagnetically (e.g., by ultraviolet or other forms of electromagnetic radiation, such as, for example, laser electromagnetic radiation), or thermally treating (e.g., using electronics on plastic by laser release (EPLaR™), using surface free technology by laser annealing/ablation (SUFTLA™), etc.) the adhesive or the adhesion modification layer.

In many embodiments, activity 109 can be omitted. When method 100 is implemented with activity 109, activity 109 is performed before activity 110 as described below. In some embodiments, activity 109 can occur before activity 108, or vice versa.

Figure 15:
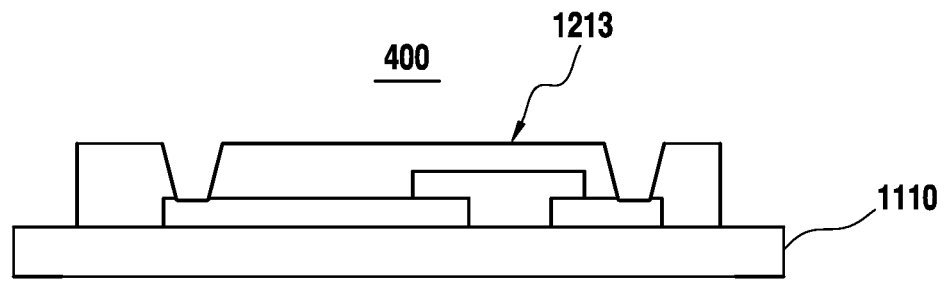
FIG. 15 illustrates a cross-sectional view of the device substrate of the semiconductor device after decoupling the device substrate from the carrier substrate, according to the embodiment of FIG. 4.
Figure 16:
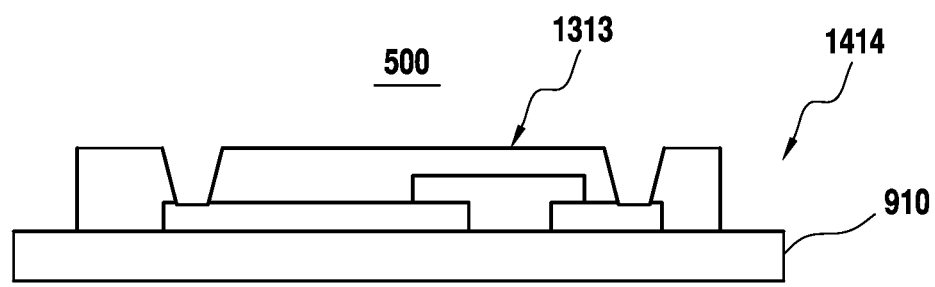
FIG. 16 illustrates a cross-sectional view of the device portion of the device substrate of the semiconductor device after decoupling the device portion from the carrier substrate, according to the embodiment of FIG. 5.

Next, method 100 can comprise activity 110 of decoupling (e.g., mechanically) the device substrate (or the device portion of the device substrate when applicable) from the carrier substrate. FIG. 15 illustrates a cross-sectional view of device substrate 1110 of semiconductor device 400 after providing semiconductor element(s) 1213 and after decoupling device substrate 1110 from carrier substrate 401 (FIG. 4), according to the embodiment of FIG. 4; and FIG. 16 illustrates a cross-sectional view of device portion 1414 of device substrate 910 of semiconductor device 500 after providing semiconductor element(s) 1313 and after decoupling device portion 1414 from carrier substrate 501 (FIG. 5), according to the embodiment of FIG. 5.

In many embodiments, activity 110 can be performed by applying a release force (e.g., a steady release force) to the device substrate (or the device portion of the device substrate when applicable). In many embodiments, the release force can be applied to the device substrate (or the device portion of the device substrate when applicable) by peeling (e.g., by hand) the device substrate (or the device portion of the device substrate when applicable) from the adhesion modification layer and/or the carrier substrate, as applicable. In these or other embodiments, the release force can be applied (or augmented) by inserting a blade under the device substrate (or the device portion of the device substrate when applicable) and pressing on the device substrate (or the device portion of the device substrate when applicable) in a direction away from the adhesion modification layer and/or the carrier substrate, as applicable.

Further, in these or other embodiments, activity 110 can be performed by severing the device substrate (or the device portion of the device substrate when applicable) from the adhesion modification layer and/or the carrier substrate, such as, for example, using any suitable cutting implement (e.g., a blade, a laser, etc.). Severing the device substrate (or the device portion of the device substrate when applicable) from the adhesion modification layer and/or the carrier substrate can be performed alternatively to or as part of the activity of applying the release force to the device substrate (or the device portion of the device substrate when applicable).

In many embodiments, maintaining an angle of less than or equal to approximately 45 degrees between the device substrate (or the device portion of the device substrate when applicable) and the adhesion modification layer and/or carrier substrate when performing activity 110 can mitigate or prevent damage to the semiconductor element(s) at the device substrate (or the device portion of the device substrate when applicable).

Further, advantageously, in many embodiments, activity 110 can be performed without first lowering the first bonding force and/or the second bonding force, such as, for example, by chemically, electromagnetically (e.g., by ultraviolet or other forms of electromagnetic radiation, such as, for example, laser electromagnetic radiation), or thermally treating (e.g., using electronics on plastic by laser release (e.g., an EPLaR™ process), using surface free technology by laser annealing/ablation (e.g., a SUFTLA™ process), etc.) the adhesive or the adhesion modification layer (e.g., modifying a structure of the adhesive or the adhesion modification layer). That is, the first bonding force and/or the second bonding force can remain approximately constant, and in many examples, at least remain low enough to permit mechanical debonding, directly up until activity 110 is performed. Accordingly, by avoiding using chemical, electromagnetic, or thermal treatments, device defects of the semiconductor element(s) and/or decreased semiconductor device yield that can result from using such chemical, electromagnetic, or thermal treatments can be reduced or eliminated. For example, electromagnetic treatments can damage the semiconductor element(s) through heat distortion and/or formation of particulate debris. Meanwhile, chemical treatments can damage the semiconductor element(s) by exposing the semiconductor element(s) to the chemical(s), resulting in degradation of the semiconductor element(s). Moreover, using chemical treatments may require subsequent cleaning to remove any residual chemicals from the semiconductor element(s) and/or may not permit the device substrate (or the device portion of the device substrate when applicable) to be kept approximately flat during decoupling because physically constraining the device substrate (or the device portion of the device substrate when applicable) while immersing the device substrate (or the device portion of the device substrate when applicable) in chemicals can be challenging.

Further, method 100 can comprise activity 111 of cleaning the carrier substrate and/or the adhesion modification layer, such as, for example, to remove residual parts of device layer, the adhesive, and/or semiconductor element(s) from the carrier substrate and/or the adhesion modification layer remaining after performing activity 110. In some embodiments, activity 111 be performed by cleaning the carrier substrate and/or the adhesion modification layer with plasma (e.g., oxygen plasma) or with an ultrasonic bath. Accordingly, in many embodiments, method 100 can be repeated one or more times using the same carrier substrate and/or adhesion modification layer.

In various embodiments, when method 100 is implemented with activity 104 (i.e., with an adhesive bonding), the adhesion modification layer is operable to permit the device substrate to be decoupled from the carrier substrate (e.g., by activity 110) such that little or none of the adhesive remains at the first surface of the device substrate immediately after or as a result of the decoupling (i.e., without performing additional manufacturing activities to remove the adhesive). For example, in some embodiments, less than approximately five, three, two, or one percent of the adhesive remains at the first surface of the device substrate immediately after or as a result of the decoupling. Meanwhile, in these or other embodiments, after the decoupling, the carrier substrate can remain coupled to the adhesion modification layer and some, a majority, substantially all, or all of the adhesive can remain coupled to the adhesion modification layer.

Generally, when implementing conventional techniques for manufacturing electronic devices that involve coupling and decoupling device substrates (e.g., flexible substrates, such as, for example, polyethylene naphthalate, polyethylene terephthalate, glass, etc.) to and from carrier substrates (e.g., rigid substrates) with adhesives, residual adhesive remaining at the device substrate after decoupling can render part or all of the electronic devices defective. Such defects can (i) reduce device manufacturing yields and/or (ii) increase manufacturing complexity, time, and/or cost required in order to remove such residual adhesive. However, because the bonding force of the adhesion modification layer of method 100 with the device substrate and/or adhesive is greater than the bonding force between the device substrate and/or adhesive and the carrier substrate alone, little or none of the adhesive remains at the device substrate immediately after or as a result of the decoupling when implementing method 100. Accordingly, because method 100 can be implemented such that little or none of the adhesive remains at the device substrate immediately after or as a result of the decoupling, device defects can be reduced and device manufacturing yields can be increased without the need for additional manufacturing activities that can increase the complexity, time, and/or cost of manufacturing electronic devices.

Turning ahead in the drawings, FIGS. 17-20 provide various graphs illustrating empirically through Fourier transform infrared spectrometry the reduction in residual adhesive at the device substrate when implementing method 100 (FIG. 1). Each of the graphs of FIGS. 17-20 show absorbance as a function of wavenumber where the wave number is measured in inverse centimeters and the absorbance is measured in arbitrary units.

Figure 17:
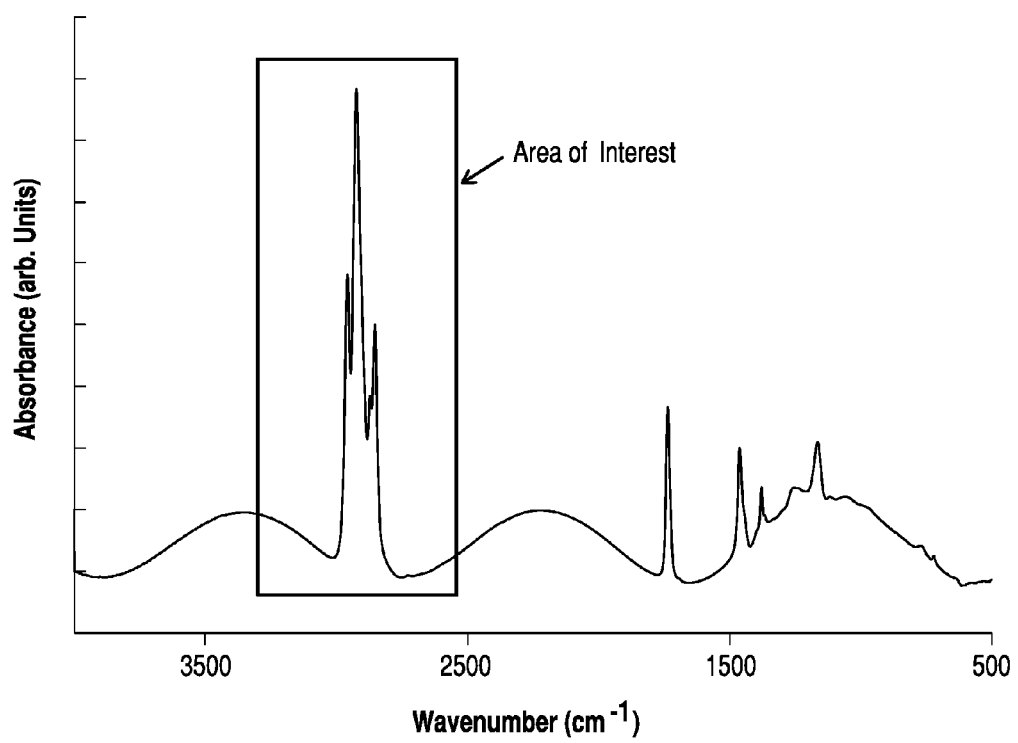
FIG. 17 is a graph illustrating through Fourier transform infrared spectrometry the absorbance as a function of wavenumber of cured adhesive bonding a polyethylene naphthalate (PEN) device substrate to a silicon carrier substrate with the spectra of the silicon carrier substrate subtracted out.

Specifically, FIG. 17 is a graph illustrating through Fourier transform infrared spectrometry the absorbance as a function of wavenumber of cured adhesive bonding a polyethylene naphthalate (PEN) device substrate to a silicon carrier substrate with the spectra of the silicon carrier substrate and the device substrate subtracted out. Notably, the polyethylene naphthalate (PEN) device substrate is substantially transparent in the area of interest. The lower wavenumbers, outside of the area of interest, have too many absorption bands. The peaks in the area of interest correspond to carbon-hydrogen stretching vibrations where the frequency of the vibration depends on the number of hydrogen atoms bonded to the carbon atom and the bonding arrangement of the carbon atoms.

Figure 18:
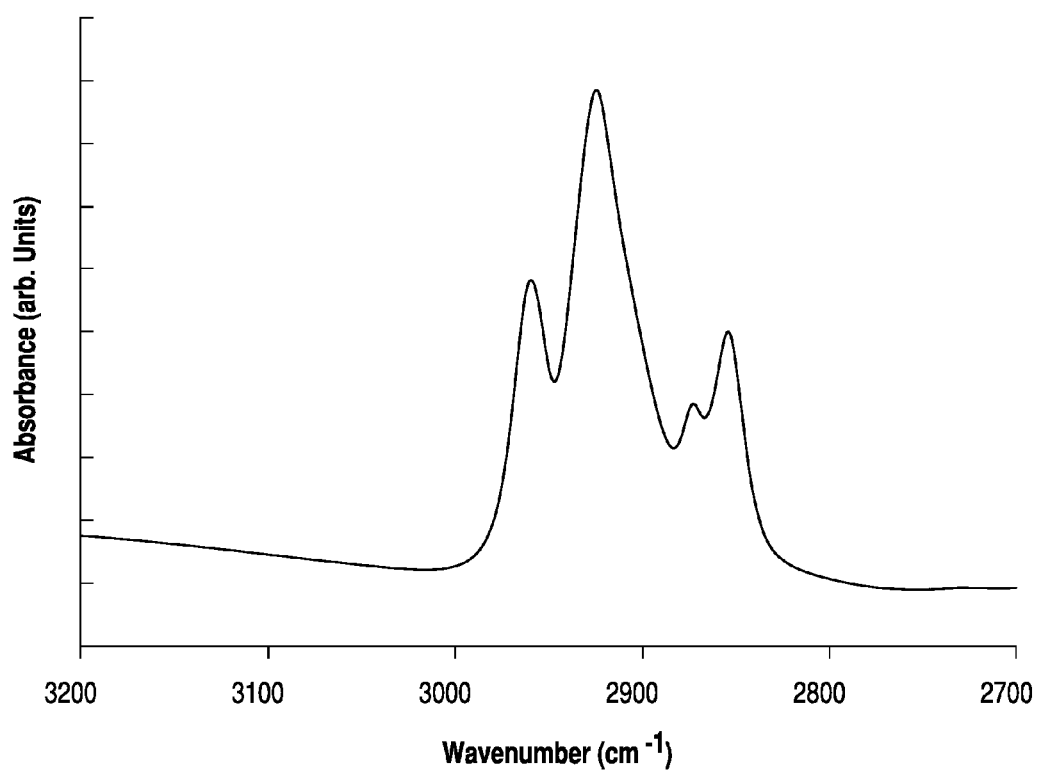
FIG. 18 is a graph illustrating the area of interest of FIG. 17.

Turning to the next drawing, FIG. 18 is a graph illustrating the area of interest of FIG. 17. There are four prominent peaks in the absorbance of the adhesive in the area of interest.

Figure 19:
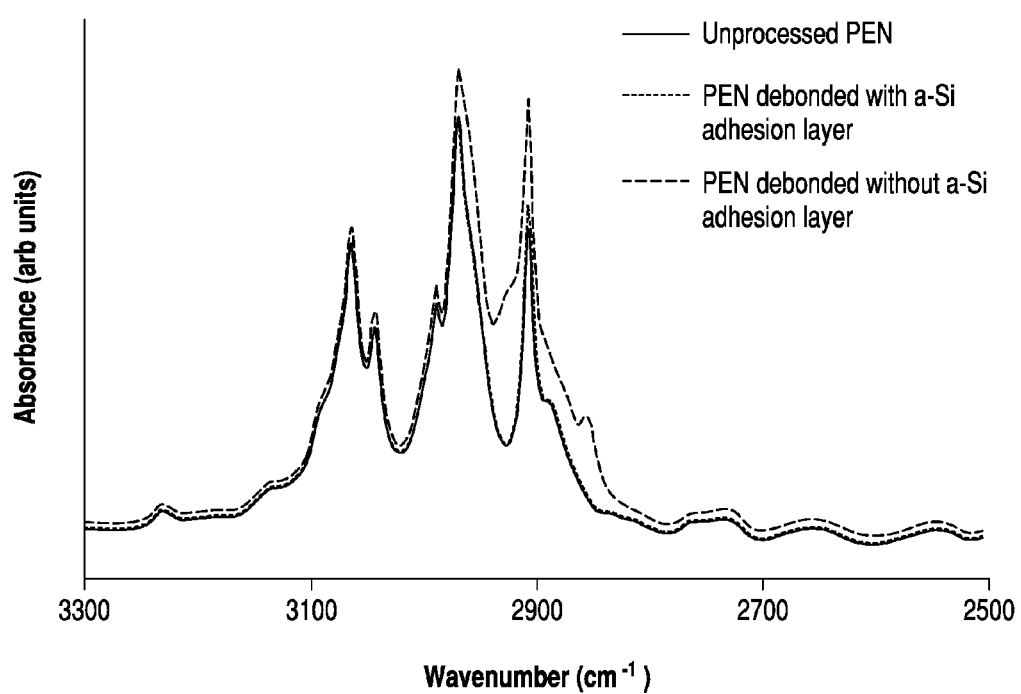
FIG. 19 is a graph illustrating through Fourier transform infrared spectrometry the absorbance as a function of wavenumber of (i) an unprocessed polyethylene naphthalate (PEN) device substrate, (ii) a polyethylene naphthalate (PEN) device substrate processed over a silicon carrier substrate with an amorphous silicon (a-Si) adhesion modification layer and decoupled from the silicon carrier substrate, and (iii) a polyethylene naphthalate device substrate processed over a silicon carrier substrate without an amorphous silicon (a-Si) adhesion modification layer and decoupled from the silicon carrier substrate.

Turning again to the next drawing, FIG. 19 is a graph illustrating through Fourier transform infrared spectrometry the absorbance as a function of wavenumber of (i) an unprocessed polyethylene naphthalate (PEN) device substrate, (ii) a polyethylene naphthalate (PEN) device substrate processed over a silicon carrier substrate with an amorphous silicon (a-Si) adhesion modification layer and decoupled from the silicon carrier substrate, and (iii) a polyethylene naphthalate device substrate processed over a silicon carrier substrate without an amorphous silicon (a-Si) adhesion modification layer and decoupled from the silicon carrier substrate.

Figure 20:
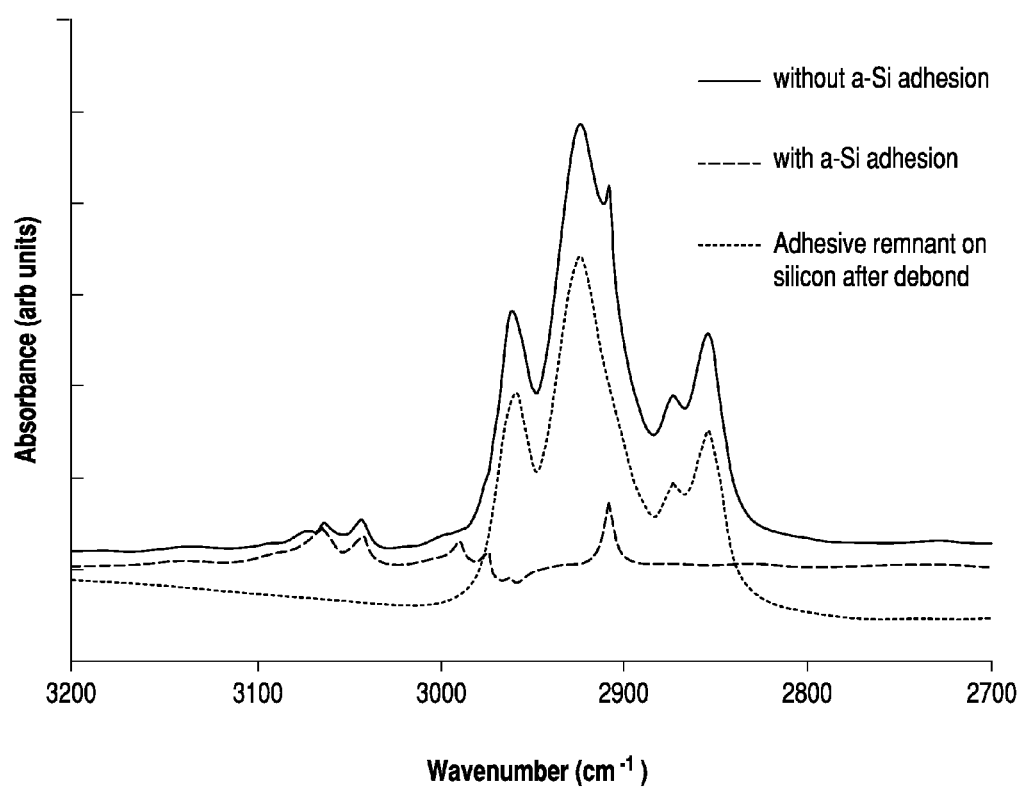
FIG. 20 is a graph illustrating through Fourier transform infrared spectrometry the absorbance as a function of wavenumber of (i) a first polyethylene naphthalate (PEN) device substrate processed over a silicon carrier substrate without an amorphous silicon adhesion modification layer where the polyethylene naphthalate (PEN) device substrate has been decoupled from the silicon carrier substrate and the spectra of a second polyethylene naphthalate (PEN) device substrate has been subtracted out, (ii) cured adhesive remaining on a silicon carrier substrate after debonding a polyethylene naphthalate (PEN) device substrate from the silicon carrier substrate with the spectra of the silicon carrier substrate subtracted out, and (iii) a first polyethylene naphthalate (PEN) device substrate processed over a silicon carrier substrate with an amorphous silicon adhesion modification layer where the polyethylene naphthalate (PEN) device substrate has been decoupled from the silicon carrier substrate and the spectra of a second polyethylene naphthalate (PEN) device substrate has been subtracted out.

Turning yet again to the next drawing, FIG. 20 is a graph illustrating through Fourier transform infrared spectrometry the absorbance as a function of wavenumber of (i) a first polyethylene naphthalate (PEN) device substrate processed over a silicon carrier substrate without an amorphous silicon adhesion modification layer where the polyethylene naphthalate (PEN) device substrate has been decoupled from the silicon carrier substrate and the spectra of a second, unprocessed polyethylene naphthalate (PEN) device substrate has been subtracted out, (ii) cured adhesive remaining on a silicon carrier substrate after debonding a polyethylene naphthalate (PEN) device substrate from the silicon carrier substrate with the spectra of the silicon carrier substrate subtracted out, and (iii) a first polyethylene naphthalate (PEN) device substrate processed over a silicon carrier substrate with an amorphous silicon adhesion modification layer where the polyethylene naphthalate (PEN) device substrate has been decoupled from the silicon carrier substrate and the spectra of a second, unprocessed polyethylene naphthalate (PEN) device substrate has been subtracted out. For clarity, items (i) through (iii) are shown in descending order at FIG. 20. Notably, all four peaks are missing for item (iii). Meanwhile, the extra peaks at items (i) and (iii) can be attributed to slight differences in the thickness and/or composition between the first polyethylene naphthalate (PEN) device substrate and the second, unprocessed polyethylene naphthalate (PEN) device substrate.

Meanwhile, in these embodiments or in other embodiments, such as, for example, when method 100 is implemented without performing activity 104 (i.e., without an adhesive), but with, for example, activity 701 (e.g., direct deposition of the device substrate at the adhesion modification layer), the adhesion modification layer can be operable to prevent premature decoupling of the device substrate during activity 107. In various examples, when implementing conventional techniques for manufacturing semiconductors that involve coupling (e.g., by direct deposition) and decoupling device substrates (e.g., flexible substrates, such as, for example, polyimide) to and from carrier substrates (e.g., rigid substrates, such as, for example, glass), the bonding force of the device substrate to the carrier substrate is often controlled by changing the formulation of the device substrate. However, batch to batch variations in the device substrate formulations can sometimes result in the device substrate decoupling from the carrier substrate sooner than is desirable. For example, machine handling of the device substrate can sometimes result in the device substrate decoupling from the carrier substrate sooner than is desirable. Premature decoupling of the device substrate from the carrier substrate can also cause device defects and pattern distortions, which reduce device manufacturing yield. Advantageously, because the bonding force of the adhesion modification layer of method 100 with the device substrate is greater than the bonding force between the device substrate and the carrier substrate alone, premature decoupling can be prevented, resulting in fewer device defects and less pattern distortion.

Notably, although the adhesion modification layer is described generally as increasing bonding force at the carrier substrate, in an alternative approach, the adhesion modification layer could be deposited at the device substrate and configured to lower bonding force. In these embodiments, when the device substrate is a flexible substrate, the adhesion modification layer would be selected from materials that would not interfere with the flexibility of the device substrate.

Further, the methods (e.g., method 100 (FIG. 1) and semiconductor devices (e.g., semiconductor device 400 (FIGS. 4, 6, 11, 12, & 15) and/or semiconductor device 500 (FIGS. 5, 9, 13, 14, & 16)) disclosed herein can be particularly well suited for implementation with semiconductor manufacturing where the semiconductor manufacturing is constrained by an upper temperature limit, such as, for example, as a result of the material(s) being used. For example, when flexible substrates, many device substrates, including many of the exemplary device substrate materials provided above, may preclude manufacturing above certain temperatures. In some embodiments, some or all of the semiconductor manufacturing may not be able to exceed approximately 160° C., 180° C., 200° C., 220° C., 250° C., or 350° C.

Various semiconductor manufacturing techniques and devices that may be well suited for implementation with the methods (e.g., method 100 (FIG. 1) and semiconductor devices (e.g., semiconductor device 400 (FIGS. 4, 6, 11, 12, & 15) and/or semiconductor device 500 (FIGS. 5, 9, 13, 14, & 16)) disclosed herein are described in the following references, the disclosure of each of which is incorporated herein by reference in its entirety: (i) U.S. patent application Ser. No. 13/118,225, filed May 27, 2011, which issued as U.S. Pat. No. 8,481,859 on Jul. 9, 2013, (ii) U.S. patent application Ser. No. 13/913,141, filed Jun. 7, 2013, which issued as U.S. Pat. No. 9,155,190 on Oct. 6, 2015, (iii) U.S. patent application Ser. No. 13/298,451, filed Nov. 17, 2011, which issued as U.S. Pat. No. 8,999,778 on Apr. 7, 2015, (iv) U.S. patent application Ser. No. 14/029,502, filed Sep. 17, 2013, which published as United States Patent Application Publication Serial No. 20140008651 on Jan. 9, 2014, (v) U.S. patent application Ser. No. 14/288,771, filed May 28, 2014, which published as United States Patent Application Publication Serial No. 20140254113 on Sep. 11, 2014, (vi) U.S. patent application Ser. No. 13/683,950, filed Nov. 21, 2012, which issued as U.S. Pat. No. 8,992,712 on Mar. 31, 2015, (vii) U.S. patent application Ser. No. 13/684,150, filed Nov. 21, 2012, which issued as U.S. Pat. No. 9,076,822 on Jul. 7, 2015, (viii) U.S. patent application Ser. No. 12/921,896, filed Nov. 29, 2010, which issued as U.S. Pat. No. 8,685,201 on Apr. 1, 2014, (ix) U.S. patent application Ser. No. 12/305,737, filed May 20, 2010, which published as United States Patent Application Publication Serial No. 20100297829 on Nov. 25, 2010, (x) U.S. patent application Ser. No. 12/571,833, filed Oct. 1, 2009, which issued as U.S. Pat. No. 8,834,655 on Sep. 16, 2014, (xi) U.S. patent application Ser. No. 12/775,366, filed May 6, 2010, which published as United States Patent Application Publication Serial No. 20110068492 on Mar. 24, 2011, (xii) U.S. patent application Ser. No. 10/551,309, filed Sep. 28, 2005, which issued as U.S. Pat. No. 7,951,687 on May 31, 2011, and (xiii) U.S. patent application Ser. No. 12/921,871, filed Oct. 13, 2010, which published as United States Patent Application Publication Serial No. 20110023672 on Feb. 3, 2011.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that one or more activities of method 100 (FIG. 1) may be comprised of many different activities, procedures, and/or processes and may be performed by many different modules and in many different orders, that any elements of FIGS. 1-20 may be modified, and that the foregoing discussion of certain of these embodiments does not necessarily represent a complete description of all possible embodiments.

Generally, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method comprising:
providing a carrier substrate;
providing an adhesion modification layer over the carrier substrate;
providing a device substrate;
after providing the adhesion modification layer over the carrier substrate, coupling the device substrate and the carrier substrate together, the adhesion modification layer being located between the device substrate and the carrier substrate when the device substrate and the carrier substrate are coupled together;

providing one or more semiconductor elements over the device substrate while the device substrate and the carrier substrate are coupled together; and after providing the one or more semiconductor elements over the device substrate while the device substrate and the carrier substrate are coupled together, mechanically decoupling the device substrate from the carrier substrate;

wherein:

the adhesion modification layer is configured so that the device substrate couples indirectly with the carrier substrate by way of the adhesion modification layer with a first bonding force that is greater than a second bonding force by which the device substrate couples with the carrier substrate absent the adhesion modification layer;

mechanically decoupling the device substrate from the carrier substrate occurs without lowering the first bonding force and without lowering the second bonding force in order to perform the mechanically decoupling the device substrate from the carrier substrate; and the adhesion modification layer remains at the device substrate after the device substrate is mechanically decoupled from the carrier substrate.

2. The method of claim 1 wherein:
coupling the device substrate and the carrier substrate together comprises bonding the device substrate directly to the adhesion modification layer.

3. The method of claim 1 wherein:
providing the adhesion modification layer over the carrier substrate comprises:
before coupling the device substrate and the carrier substrate together, etching a central portion of the adhesion modification layer so that only a perimeter portion of the adhesion modification layer remains over the carrier substrate.

4. The method of claim 1 wherein:
providing the adhesion modification layer over the carrier substrate comprises providing the adhesion modification layer over substantially all of a surface of the carrier substrate.

5. The method of claim 1 wherein:
the carrier substrate comprises a rigid substrate; and
the device substrate comprises a flexible substrate.

6. The method of claim 1 wherein:
the adhesion modification layer comprises amorphous silicon.

7. The method of claim 1 further comprising:
providing an adhesive;
wherein:
coupling the device substrate and the carrier substrate together comprises bonding the device substrate to the adhesion modification layer with the adhesive.

8. The method of claim 7 wherein:
the adhesive comprises an acrylate polymer adhesive.

9. The method of claim 7 wherein:
less than approximately five percent of the adhesive remains at the device substrate immediately after the device substrate is mechanically decoupled from the carrier substrate.

10. The method of claim 7 wherein:
none of the adhesive remains at the device substrate immediately after the device substrate is mechanically decoupled from the carrier substrate.

11. The method of claim 5 wherein:
the rigid substrate comprises at least one of alumina, silicon, glass, metal, or sapphire.

12. The method of claim 5 wherein:
the flexible substrate comprises at least one of polyethylene naphthalate, polyethylene terephthalate, polyethersulfone, polyimide, polycarbonate, cyclic olefin copolymer, liquid crystal polymer, or glass.

13. The method of claim 5 wherein:
the rigid substrate comprises at least one of alumina, silicon, glass, metal, or sapphire; and
the flexible substrate comprises at least one of polyethylene naphthalate, polyethylene terephthalate, polyethersulfone, polyimide, polycarbonate, cyclic olefin copolymer, liquid crystal polymer, or glass.

14. The method of claim 1 wherein:
the rigid substrate is devoid of silicon.

15. The method of claim 1 wherein:
the rigid substrate is devoid of amorphous silicon.

16. The method of claim 1 wherein:
providing the adhesion modification layer over the carrier substrate comprises providing the adhesion modification layer with a thickness of greater than or equal to approximately 0.05 micrometer and less than or equal to approximately 25 micrometers over the carrier substrate.

17. A method comprising:
providing a carrier substrate;
providing an adhesion modification layer over the carrier substrate;
providing a device substrate;
after providing the adhesion modification layer over the carrier substrate, coupling the device substrate and the carrier substrate together, the adhesion modification layer being located between the device substrate and the carrier substrate when the device substrate and the carrier substrate are coupled together;
providing one or more semiconductor elements over the device substrate while the device substrate and the carrier substrate are coupled together; and
after providing the one or more semiconductor elements over the device substrate while the device substrate and the carrier substrate are coupled together, mechanically decoupling the device substrate from the carrier substrate;
wherein:
the carrier substrate is a first single layer of a first homogenous material;
the adhesion modification layer is a second single layer of a second homogenous material;
the device substrate is a third single layer of a third homogenous material;
the adhesion modification layer is configured so that the device substrate couples indirectly with the carrier substrate by way of the adhesion modification layer with a first bonding force that is greater than a second bonding force by which the device substrate couples with the carrier substrate absent the adhesion modification layer;
mechanically decoupling the device substrate from the carrier substrate occurs without lowering the first bonding force and without lowering the second bonding force in order to perform the mechanically decoupling the device substrate from the carrier substrate; and the adhesion modification layer remains at the device substrate after the device substrate is mechanically decoupled from the carrier substrate.

18. The method of claim 17 wherein:

providing the adhesion modification layer over the carrier substrate comprises:

before coupling the device substrate and the carrier substrate together, etching a central portion of the adhesion modification layer so that only a perimeter portion of the adhesion modification layer remains over the carrier substrate when subsequently coupling the device substrate and the carrier substrate together.

19. The method of claim 18 wherein:

the adhesion modification layer comprises amorphous silicon.

20. The method of claim 18 wherein:

the carrier substrate is devoid of silicon.

\* \* \* \* \*